US012710474B2

(12) United States Patent
Kanemaru et al.

(10) Patent No.: US 12,710,474 B2
(45) Date of Patent: Aug. 18, 2026

(54) DEVICE FOR DIAGNOSING ELECTRIC MOTOR, METHOD FOR DIAGNOSING ELECTRIC MOTOR, AND DEVICE FOR INFERRING INDICATION OF ABNORMALITY IN ELECTRIC MOTOR

(71) Applicant: Mitsubishi Electric Corporation, Tokyo (JP)

(72) Inventors: Makoto Kanemaru, Tokyo (JP); Toshihiko Miyauchi, Tokyo (JP); Yoshiki Matsui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 231 days.

(21) Appl. No.: 18/693,996

(22) PCT Filed: Nov. 10, 2021

(86) PCT No.: PCT/JP2021/041269

§ 371 (c)(1),
(2) Date: Mar. 21, 2024

(87) PCT Pub. No.: WO2023/084625

PCT Pub. Date: May 19, 2023

(65) Prior Publication Data

US 2024/0385245 A1 Nov. 21, 2024

(51) Int. Cl.
*G01R 31/34* (2020.01)

(52) U.S. Cl.
CPC ......... *G01R 31/343* (2013.01); *G01R 31/346* (2013.01)

(58) Field of Classification Search
CPC ............................ G01R 31/343; G01R 31/346
(Continued)

(56) References Cited

U.S. PATENT DOCUMENTS 9,041,402 B2 * 5/2015 Lalonge ................. H02H 7/222 318/803
10,651,758 B2 * 5/2020 Horikoshi ............... H02M 7/06
(Continued)

FOREIGN PATENT DOCUMENTS

EP 3783376 A1 2/2021
JP 2010063287 A 3/2010
(Continued)

OTHER PUBLICATIONS

Notice of Reasons for Refusal dated Jan. 7, 2025, issued in the corresponding Japanese Patent Application No. 2023-559248, 8 pages including 4 pages of English Translation.
(Continued)

*Primary Examiner* — Giovanni Astacio-Oquendo
*Assistant Examiner* — Trung Q Nguyen
(74) *Attorney, Agent, or Firm* — Buchanan Ingersoll & Rooney PC

(57) ABSTRACT

A diagnosis device for an electric motor driven by an inverter includes a current detection circuit for detecting current of an electric motor, and a calculation processing unit which receives an output of the current detection circuit and performs winding short-circuit abnormality determination for the electric motor. The calculation processing unit includes an operation state determination unit for performing determination for an operation state of the electric motor, an initial negative-phase-sequence current analysis unit for analyzing initial negative-phase-sequence current in a normal state, and an inverter driving frequency calculation unit, and performs electric motor winding short-circuit determination in accordance with an inverter driving frequency using, as an evaluation value, difference between initial negative-phase-sequence current and negative-phase-sequence current calculated from electric motor current during
(Continued)

driving. Thus, short-circuit failure in stator windings of the electric motor can be detected accurately.

12 Claims, 18 Drawing Sheets

(58) Field of Classification Search
USPC .......................... 324/500, 600, 76.11, 765.01
See application file for complete search history.

(56) References Cited

U.S. PATENT DOCUMENTS

| | | | | |
|---|---|---|---|---|
| 11,005,409 | B2 * | 5/2021 | Satou | H02M 5/44 |
| 2014/0160602 | A1 * | 6/2014 | Gu | H02P 29/0243<br>702/58 |
| 2021/0148990 | A1 * | 5/2021 | Bohlländer | G01R 31/52 |
| 2022/0305951 | A1 * | 9/2022 | Shigemori | B60L 58/21 |
| 2023/0194612 | A1 * | 6/2023 | Singh | G01R 31/343<br>324/765.01 |
| 2023/0204640 | A1 * | 6/2023 | Henwood | G01R 31/343<br>324/765.01 |

FOREIGN PATENT DOCUMENTS

| | | | |
|---|---|---|---|
| JP | 2014117141 | A | 6/2014 |
| WO | 2019202651 | A1 | 10/2019 |
| WO | 2021199383 | A1 | 10/2021 |

OTHER PUBLICATIONS

Office Action dated Jun. 11, 2025, issued in the corresponding Korean Patent Application No. 10-2024-7012904, 16 pages including 8 pages of English Translation.

International Search Report (PCT/ISA/210) with translation and Written Opinion (PCT/ISA/237) mailed on Feb. 8, 2022, by the Japan Patent Office as the International Searching Authority for International Application No. PCT/JP2021/041269. (9 pages).

Office Action dated Feb. 24, 2026, issued in the corresponding Korean Patent Application No. 10-2024-7012904, 15 pages including 8 pages of machine English Translation.

* cited by examiner

| INVERTER DRIVING FREQUENCY (Hz) | INITIAL NEGATIVE-PHASE-SEQUENCE CURRENT (A) |
|---|---|
| 0~5 | 0.1 |
| 5~10 | 0.15 |
| 10~15 | 0.17 |
| ····· | ····· |
| 110~115 | 0.2 |
| 115~120 | 0.22 |
| ····· | ····· |

FIG. 11

| VOLTAGE IMBALANCE RATE (%) | INVERTER DRIVING FREQUENCY (HZ) | INITIAL NEGATIVE-PHASE-SEQUENCE CURRENT (A) |
|---|---|---|
| 0-0.1 | 0 - 5 | 0.10 |
| | 5 - 10 | 0.15 |
| | ... | |
| | 110 - 115 | 0.20 |
| | 115 - 120 | 0.30 |
| | .... | |
| 0.1-0.2 | 0 - 5 | 0.12 |
| | 5 - 10 | 0.17 |
| | ... | |
| | 110 - 115 | 0.22 |
| | 115 - 120 | 0.33 |
| | .... | |
| .... | .... | |

FIG. 12

| VOLTAGE IMBALANCE RATE (%) | VOLTAGE EFFECTIVE VALUE (V) | INITIAL NEGATIVE-PHASE-SEQUENCE CURRENT (A) |
|---|---|---|
| 0-0.1 | 100 - 110 | 0.10 |
| | 110 - 120 | 0.15 |
| | ... | |
| | 200 - 210 | 0.17 |
| | 210 - 220 | 0.19 |
| | .... | |
| 0.1-0.2 | 100 - 110 | 0.15 |
| | 110 - 120 | 0.18 |
| | ... | |
| | 200 - 210 | 0.24 |
| | 210 - 220 | 0.26 |
| | .... | |
| .... | .... | |

300

ABNORMALITY INDICATION INFERENCE DEVICE FOR ELECTRIC MOTOR 100,100a,100b

DIAGNOSIS DEVICE FOR ELECTRIC MOTOR

320

INFERENCE DEVICE

310

LEARNING DEVICE

313

TRAINED MODEL STORAGE UNIT

DEVICE FOR DIAGNOSING ELECTRIC MOTOR, METHOD FOR DIAGNOSING ELECTRIC MOTOR, AND DEVICE FOR INFERRING INDICATION OF ABNORMALITY IN ELECTRIC MOTOR

TECHNICAL FIELD

The present disclosure relates to a diagnosis device for electric motor, a diagnosis method for electric motor, and an abnormality indication inference device for electric motor.

BACKGROUND ART

There are a lot of electric motors (motors) in a plant, and diagnosis for the equipment thereof is conducted by person's senses in a maintenance department. In particular, for electric motors which are of high importance, regular diagnosis is needed and thus the cost increases. Further, if such an electric motor starts to deteriorate, the deterioration progresses at an accelerating pace. In a case of an AC motor, a gap and a damaged part of an insulation material caused by mechanical stress and thermal deterioration induce layer short-circuit through discharge or the like and this can suddenly lead to insulation breakage. Therefore, once an electric motor is deteriorated, the deterioration is only going to progress further.

Accordingly, there is increasing interest in technology for constantly monitoring electric motors. However, many of electric motor constantly monitoring technologies are based on the premise that various measurement devices such as sensors are attached for each electric motor. The measurement devices are, for example, a torque meter, an encoder, an acceleration sensor, and the like. However, application to a motor control center which performs centralized management for hundreds to thousands of electric motors is not realistic because the number of wires increases. Therefore, there is a need for a device that is capable of simply diagnosing the states of electric motors on the basis of information about current and voltage measured in a motor control center without using special sensors, and achieves improved reliability, productivity, and safety.

In this regard, the applicant has proposed a diagnosis device for electric motor that includes a current detection circuit for detecting current of an electric motor, and a calculation processing unit which receives an output of the current detection circuit and performs determination for winding short-circuit abnormality of an electric motor (see Patent Document 1). The calculation processing unit includes an operation state determination unit which performs determination for the operation state of the electric motor, and an initial negative-phase-sequence current analysis unit which analyzes initial negative-phase-sequence current in a normal state, and the calculation processing unit performs determination for winding short-circuit of the electric motor, using, as an evaluation value, a difference between initial negative-phase-sequence current and negative-phase-sequence current calculated from current of the electric motor during driving.

CITATION LIST

Patent Document

Patent Document 1: WO2019/202651

SUMMARY OF THE INVENTION

Problem to be Solved by the Invention

The diagnosis device for electric motor disclosed above in Patent Document 1 is means for detecting winding short-circuit of an electric motor driven by a commercial power supply. Recently, there have been an increasing number of electric motors driven by inverters, and therefore it is required to detect winding short-circuit of an electric motor during inverter driving. However, the diagnosis device for electric motor in Patent Document 1 does not take into consideration a feature during inverter driving that an electric motor is driven with an inverter driving frequency changed.

The present disclosure has been made to solve the above problem, and an object of the present disclosure is to provide a diagnosis device for electric motor, a diagnosis method for electric motor, and an abnormality indication inference device for electric motor that can detect winding short-circuit of an electric motor during inverter driving.

Means to Solve the Problem

A diagnosis device for electric motor according to the present disclosure includes: a current detection circuit for detecting current of an electric motor driven by an inverter; and a calculation processing unit which receives an output of the current detection circuit and performs determination for winding short-circuit abnormality of the electric motor. The calculation processing unit includes: an operation state determination unit which calculates an effective value from the current of the electric motor and performs determination for an operation state; an inverter driving frequency calculation unit which calculates an inverter driving frequency; an initial negative-phase-sequence current analysis unit which analyzes initial negative-phase-sequence current in a normal state in accordance with the calculated inverter driving frequency; an evaluation value analysis unit which calculates an evaluation value for winding short-circuit from a difference between negative-phase-sequence current calculated from the current of the electric motor during driving and the initial negative-phase-sequence current corresponding to the inverter driving frequency calculated during driving; and a winding short-circuit determination unit which performs determination for winding short-circuit of the electric motor through comparison between the calculated evaluation value and a predetermined evaluation threshold.

A diagnosis method for electric motor according to the present disclosure includes the steps of: detecting current of an electric motor driven by an inverter; calculating an effective value from the current of the electric motor and performing determination for an operation state of the electric motor; calculating an inverter driving frequency for driving the electric motor; analyzing initial negative-phase-sequence current in a normal state in accordance with the calculated inverter driving frequency; calculating an evaluation value for winding short-circuit from a difference between negative-phase-sequence current calculated from the current of the electric motor during driving and the initial negative-phase-sequence current corresponding to the inverter driving frequency calculated during driving; and performing determination for winding short-circuit of the electric motor through comparison between the calculated evaluation value and a predetermined evaluation threshold.

An abnormality indication inference device for electric motor according to the present disclosure is used with the above diagnosis device for electric motor, and includes: a learning device including a data acquisition unit which acquires training data including the evaluation value and a winding short-circuit determination result corresponding to the evaluation value, from the diagnosis device for electric motor, and a model generation unit which generates a trained model for inferring an abnormality indication inference result for the electric motor from data of the evaluation value of the diagnosis device for electric motor, using the training data; and an inference device including an inference unit which outputs an abnormality indication inference result for the electric motor from data of the evaluation value of the diagnosis device for electric motor, using the trained model.

Effect of the Invention

According to the present disclosure, determination for winding short-circuit is performed using, as an evaluation value, a difference between the initial negative-phase-sequence current and negative-phase-sequence current calculated from current during driving of the electric motor driven by the inverter. Thus, negative-phase-sequence admittance is not calculated and the inverter driving frequency is taken into consideration in determination for winding short-circuit. Therefore, short-circuit failure in stator windings of the electric motor can be detected accurately.

The abnormality indication inference device for electric motor according to the present disclosure generates training data from the diagnosis device for electric motor and generates a trained model. Thus, by using the trained model, it becomes possible to easily infer an abnormality indication of the electric motor.

BRIEF DESCRIPTION OF THE DRAWINGS

FIG. 6A illustrates an example in which abnormality of an electric motor cannot be detected in a case where the inverter driving frequency is changed.

FIG. 6B illustrates an example in which abnormality of an electric motor can be detected in a case where the inverter driving frequency is changed.

FIG. 11 shows a relationship between the inverter driving frequency and the initial negative-phase-sequence current at each voltage imbalance rate.

FIG. 12 shows a relationship between a voltage effective value and the initial negative-phase-sequence current at each voltage imbalance rate.

DESCRIPTION OF EMBODIMENTS

Figure 1:
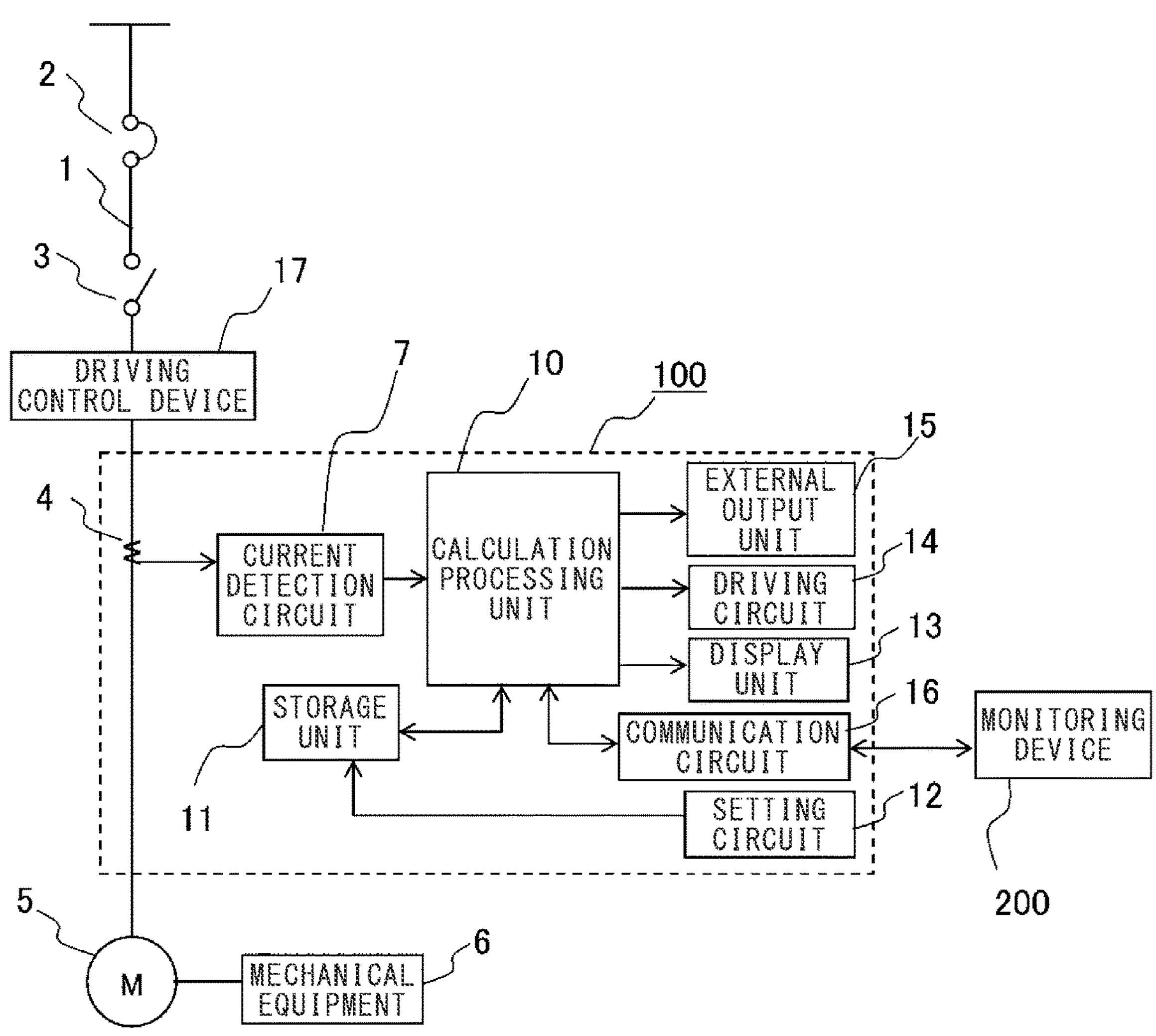
FIG. 1 is a circuit configuration diagram showing a diagnosis device for electric motor according to embodiment 1.

Hereinafter, embodiments will be described with reference to the drawings. In the drawings, the same reference characters denote the same or corresponding parts.

Embodiment 1

Hereinafter, a diagnosis device for electric motor according to embodiment 1 will be described with reference to FIG. 1 to FIG. 8.

FIG. 1 is a circuit configuration diagram showing a diagnosis device for electric motor according to embodiment 1, which is mainly used in a control center which is an enclosed switchboard. In the drawings, a main circuit 1 of a power supply led from a power system is provided with a circuit breaker 2, an electromagnetic contactor 3, a driving control device 17, and an instrument transformer 4 for detecting load current of the main circuit 1. Further, an electric motor 5 which is a load is connected, and mechanical equipment 6 is driven by the electric motor (motor) 5.

The driving control device 17 converts voltage of the main circuit 1 of the power supply, to supply power for driving the electric motor 5. The driving control device 17 is formed by a so-called inverter, and includes a circuit for converting voltage and a control unit for controlling the circuit.

A diagnosis device 100 for electric motor includes a current detection circuit 7 connected to the instrument transformer 4, a calculation processing unit 10, a storage unit 11, a setting circuit 12, a display unit 13, a driving circuit 14, an external output unit 15, and a communication circuit 16.

The current detection circuit 7 converts load current of the main circuit 1 detected by the instrument transformer 4, to a predetermined signal such as phase current of the electric motor 5, to detect current of the electric motor 5, and outputs the signal to the calculation processing unit 10 and the storage unit 11. That is, the current detection circuit 7 detects current of the electric motor 5 from current flowing through the main circuit 1 of the power supply connected to the electric motor 5.

The calculation processing unit 10 receives an output of the current detection circuit 7, and calculates negative-phase-sequence current and the like through analysis on current of the electric motor, to perform determination for winding short-circuit during driving of the electric motor.

The storage unit 11 is connected to the calculation processing unit 10 and the setting circuit 12, and transmits/receives data to/from the calculation processing unit 10. The setting circuit 12 connected to the storage unit 11 has a set key, and by pressing (e.g., holding down) the set key, initial data in a normal state is stored and retained in the storage unit 11. The data can be stored until the set key is canceled.

The display unit 13 is connected to the calculation processing unit 10, and displays a detected physical quantity such as load current, and an abnormal state, a warning, and the like when the calculation processing unit 10 has detected abnormality in the electric motor 5.

The drive circuit 14 is connected to the calculation processing unit 10, and outputs a control signal for opening/closing the electromagnetic contactor 3 on the basis of a result of calculation performed by the calculation processing unit 10 on the basis of a current signal detected by the instrument transformer 4.

The external output unit 15 outputs a signal of an abnormal state, a warning, and the like from the calculation processing unit 10, to outside.

An external monitoring device 200 is formed from a personal computer (PC) or the like, and is connected to one or a plurality of diagnosis devices 100 for electric motor. The external monitoring device 200 receives information of the calculation processing unit 10 via the communication circuit 16 as necessary, and monitors the operation condition of the diagnosis device 100 for electric motor. Connection between the external monitoring device 200 and the communication circuit 16 of the diagnosis device 100 for electric motor may be made using a cable or wirelessly. The connection may be made via the Internet by constructing a network with the plurality of diagnosis devices 100 for electric motor.

Figure 2:
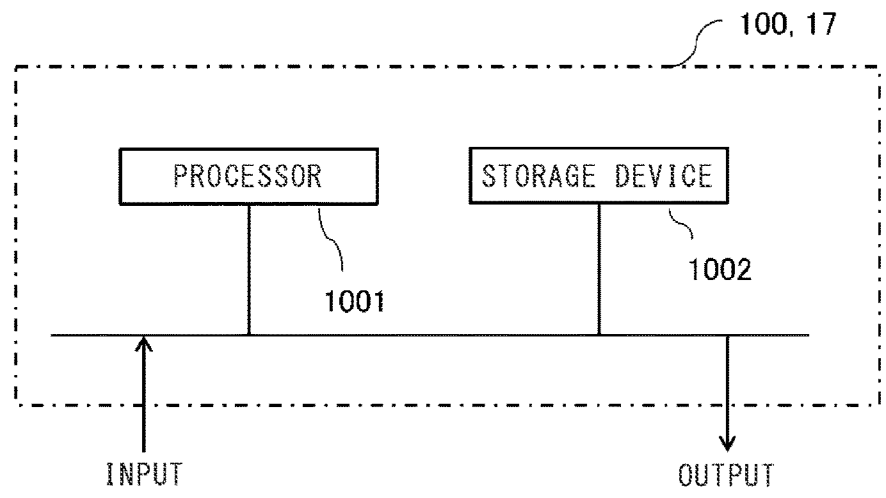
FIG. 2 is a hardware configuration diagram of the diagnosis device for electric motor according to embodiment 1.

The diagnosis device 100 for electric motor is composed of a processor 1001 and a storage device 1002 as shown in a hardware example in FIG. 2. Although not shown, the storage device 1002 is provided with a volatile storage device such as a random access memory (RAM), and a nonvolatile auxiliary storage device (e.g., electrically erasable programmable read only memory (EEPROM)) such as a flash memory. Instead of the flash memory, an auxiliary storage device of a hard disk may be provided. The processor 1001 executes a program inputted from the storage device 1002. In this case, the program is inputted from the auxiliary storage device to the processor 1001 via the volatile storage device. The processor 1001 may output data such as a calculation result to the volatile storage device of the storage device 1002 or may store such data into the auxiliary storage device via the volatile storage device.

The processor 1001 implements the functions of the calculation processing unit 10, the storage unit 11, the setting circuit 12, the display unit 13, the driving circuit 14, the external output unit 15, and the communication circuit 16 of the diagnosis device 100 for electric motor, by executing the program.

The processor 1001 is provided with a central processing unit (CPU) as a calculation processing device. As the calculation processing device, various logical circuits such as an application specific integrated circuit (ASIC), an integrated circuit (IC), and a digital signal processor (DSP), various signal processing circuits, and the like may be provided.

The driving control device 17 also has such a hardware configuration as shown in FIG. 2 and executes operation as an inverter.

Figure 3:
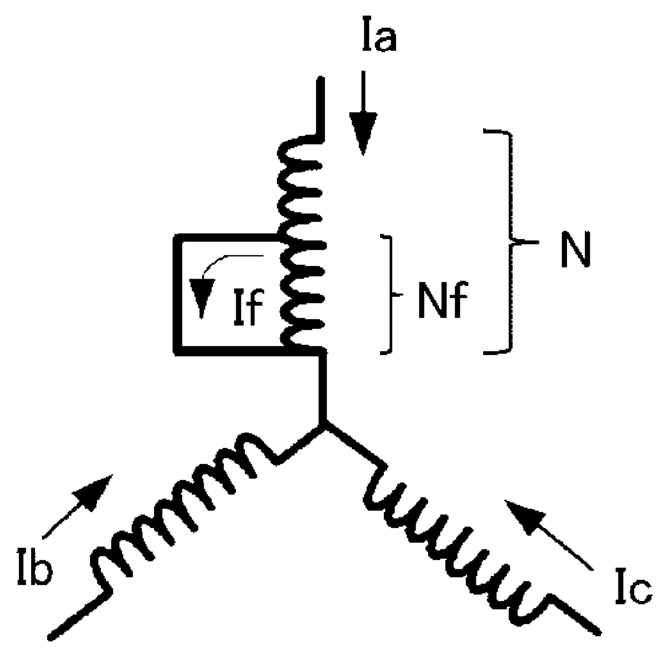
FIG. 3 conceptually illustrates winding short-circuit.

FIG. 3 conceptually illustrates winding short-circuit to be diagnosed in the present disclosure. In the drawing, it is assumed that short-circuit occurs in phase a and short-circuit current If flows, and the number of short-circuited winding turns is denoted by Nf. A short-circuit rate μ, which is a ratio of Nf to the number of whole winding turns N, is generalized as shown below:

$$\mu = Nf/N.$$

In addition, in the stator windings of the electric motor 5, either of short-circuit in the same layer and short-circuit between layers can occur. In the present embodiment, these two types of short-circuit are both diagnosed as winding short-circuit.

In the present disclosure, rating information for the electric motor 5 need not be inputted before start of operation.

Figure 4:
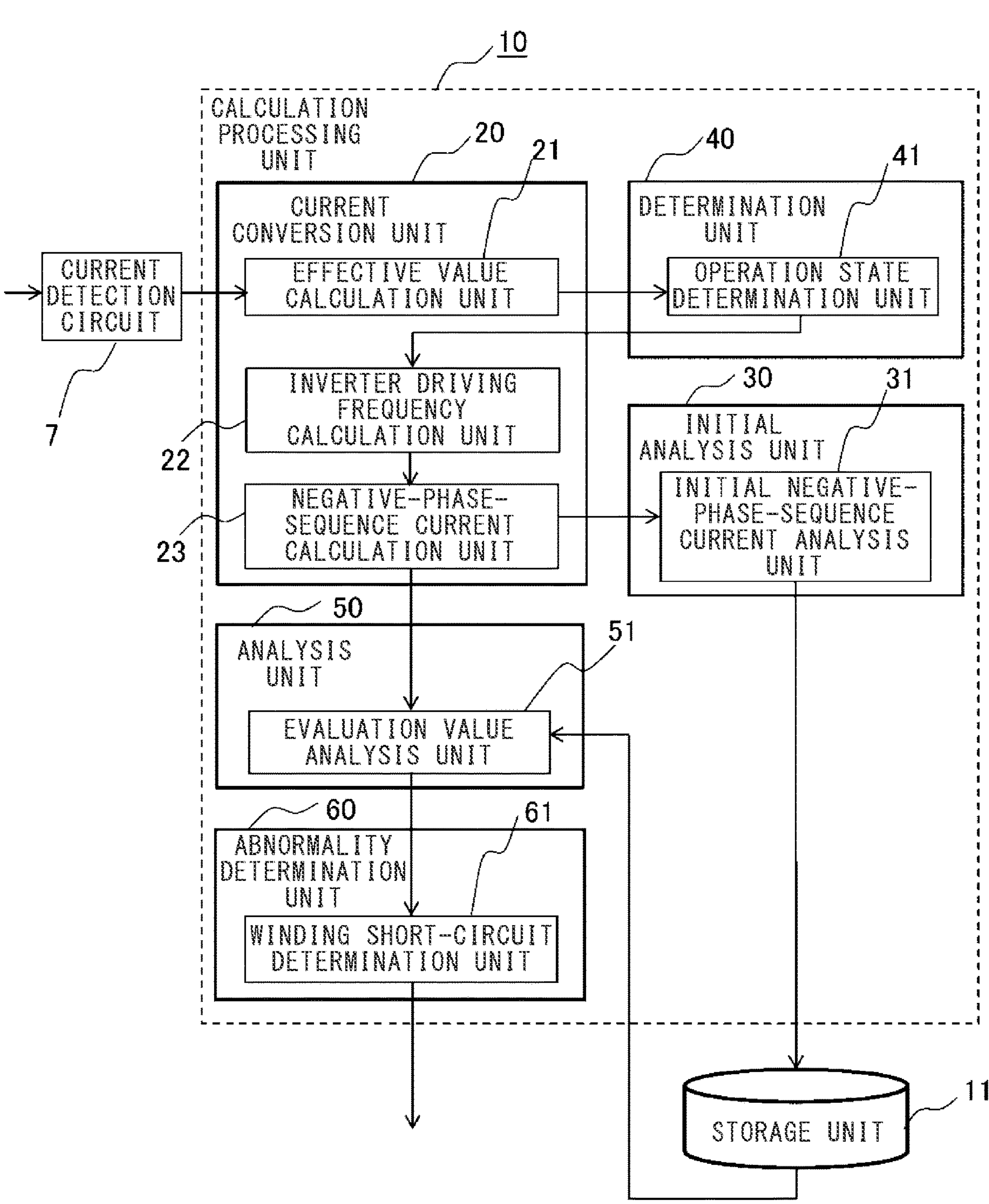
FIG. 4 is a configuration diagram of a calculation processing unit of the diagnosis device for electric motor according to embodiment 1.

FIG. 4 is a configuration diagram schematically showing the calculation processing unit 10 in the diagnosis device for electric motor according to embodiment 1. The calculation processing unit 10 includes a current conversion unit 20, an initial analysis unit 30, a determination unit 40, an analysis unit 50, and an abnormality determination unit 60.

The current conversion unit 20 includes an effective value calculation unit 21, an inverter driving frequency calculation unit 22, and a negative-phase-sequence current calculation unit 23, and calculates negative-phase-sequence current Isn by the following Expression (1) through symmetric coordinate conversion processing on the basis of three-phase currents detected by the current detection circuit 7.

[Mathematical 1]

$$I_{sn} = \frac{1}{3}\left(I_u + a^2 I_v + a I_w\right) \tag{1}$$

$$a = e^{j\frac{2}{3}\pi}$$

Here, Isn is the negative-phase-sequence current, Iu is u-phase current, Iv is v-phase current, and Iw is w-phase current.

The initial analysis unit 30 includes an initial negative-phase-sequence current analysis unit 31. The initial negative-phase-sequence current analysis unit 31 analyzes a negative-phase-sequence current value Isn in a normal state (an initial state of the electric motor or a state in which there is no failure in the electric motor) before winding short-circuit determination. For example, negative-phase-sequence current values for one month are calculated, and an averaged value thereof is used as an initial negative-phase-sequence current value Isn0. At the same time, a standard deviation σ may be calculated to find dispersion.

At this time, the initial negative-phase-sequence current value Isn0 is stored in the storage unit 11 together with the inverter driving frequency calculated by the inverter driving frequency calculation unit 22. Regarding the inverter driving frequency, the inverter driving frequency calculation unit 22 receives a signal from the inside of the inverter to specify the frequency, thus calculating the inverter driving frequency. Alternatively, the inverter driving frequency calculation unit 22 calculates the inverter driving frequency from a current waveform. A specific method for calculating the inverter driving frequency from a current waveform is as follows. An AC waveform of current detected by the current detection circuit 7 is sampled. In order to measure the time between zero-cross points of the AC waveform over a plurality of cycles, the number of sampling points is counted and the time between zero-cross points of the AC waveform is calculated. The frequency is calculated from the calculated time. Here, the reason why measurement is performed over a plurality of cycles is as follows. That is, the sampling interval can be a factor of error, but through a plurality of times of measurement, the error is reduced by being divided by the number of times of measurement.

Figure 5:
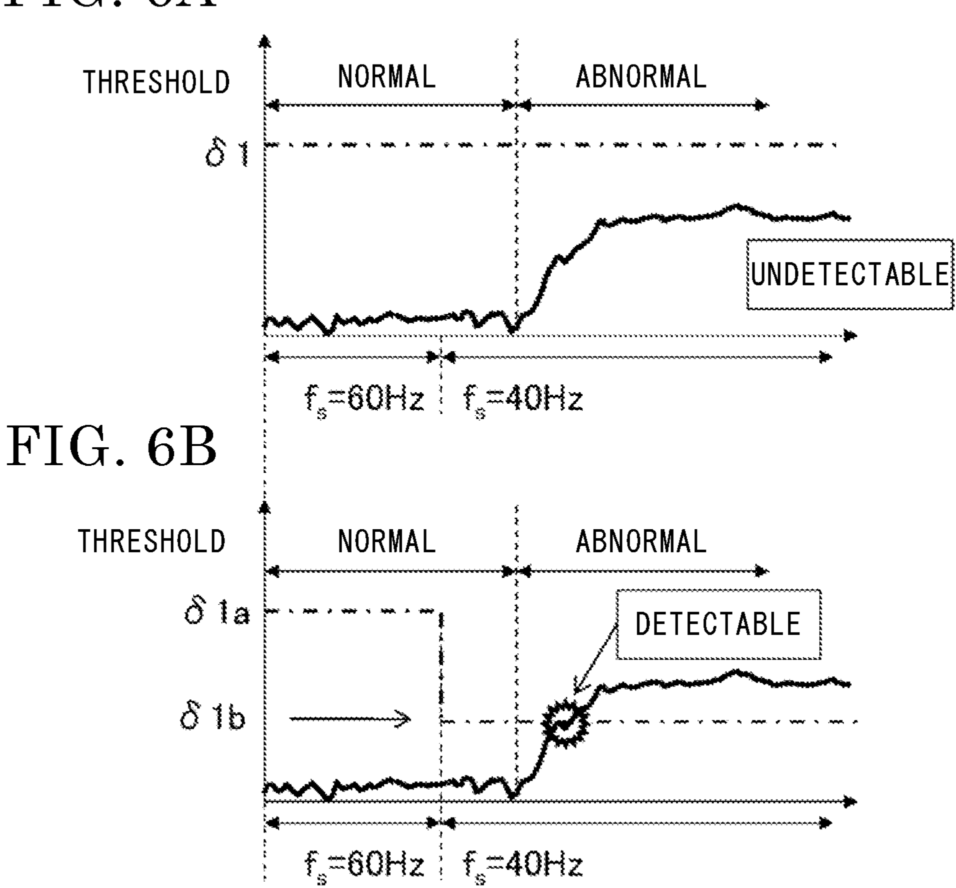
FIG. 5 shows a relationship between an inverter driving frequency and initial negative-phase-sequence current.

FIG. 5 shows a relationship between the inverter driving frequency and the initial negative-phase-sequence current. In this way, the initial negative-phase-sequence current value is stored for each range of inverter driving frequencies. That is, the inverter frequency and the initial negative-phase-sequence current are stored in association with each other in a map form. The reason therefor is that the negative-phase-sequence current changes depending on the inverter driving frequency. Instead of storage for each inverter driving frequency, the initial negative-phase-sequence current value may be stored for each numerical range of current effective values. This is because it is preferable to perform winding short-circuit determination when the inverter driving frequency or the current effective value is under the same condition. A range of inverter driving frequencies in FIG. 5 is defined as 5 (Hz) or more and less than 10 (Hz), for example.

The determination unit 40 includes an operation state determination unit 41. The operation state determination unit 41 performs determination for the operation state of the electric motor on the basis of the effective value of current calculated by the effective value calculation unit 21. The determination for the operation state of the electric motor may be performed on the basis of the instantaneous value of current or an ON/OFF signal for the electromagnetic contactor 3, instead of the effective value of current.

The analysis unit 50 includes an evaluation value analysis unit 51, and performs analysis for determination to be performed in a winding short-circuit determination unit 61 of the abnormality determination unit 60. The evaluation value analysis unit 51 calculates an evaluation value A=|Isn−Isn0|. At this time, it is preferable that the negative-phase-sequence current Isn and the initial negative-phase-sequence current Isn0 correspond to the same inverter driving frequency. That is, the negative-phase-sequence current Isn and the initial negative-phase-sequence current Isn0 calculated under the same inverter driving frequency are used.

Next, calculation for the evaluation value A will be described.

Winding short-circuit is short-circuit between coil wires. When winding short-circuit occurs, the three-phase stator currents become asymmetric, and therefore detection can be performed from a negative-phase-sequence component. Where the short-circuit rate when winding short-circuit occurs in a part of stator windings of a three-phase induction electric motor is denoted by μ (μ=Nf/N) and μ<<1 is assumed, the following relational expressions are obtained among positive-phase-sequence voltage Vsp, negative-phase-sequence voltage Vsn, positive-phase-sequence current Isp, and negative-phase-sequence current Isn.

[Mathematical 2]

$$\begin{bmatrix} \tilde{I}_{sp} \\ \tilde{I}_{sn} \end{bmatrix} = \begin{bmatrix} Y_{pp} & Y_{pn} \\ Y_{np} & Y_{nn} \end{bmatrix} \begin{bmatrix} \tilde{V}_{sp} \\ \tilde{V}_{sn} \end{bmatrix} \tag{2}$$

[Mathematical 3]

$$Y_{pn} = Y_{np} = \frac{\mu^2}{3\,(j\mu\omega L_{ls} + r_f + \mu r_s)} \tag{3}$$

[Mathematical 4]

$$Y_{pp} = Y_p + Y_{pn} = \frac{r_r + js\,\omega L_r}{s\,\omega^2 L_m^2 + (r_s + j\omega L_s)(r_r + js\,\omega L_r)} + \frac{\mu^2}{3(j\mu\omega L_{ls} + r_f + \mu r_s)} \tag{4}$$

[Mathematical 5]

$$Y_{nn} = Y_n + Y_{np} = \frac{r_r + j(2-s)\omega L_r}{(2-s)\omega^2 L_m^2 + (r_s + j\omega L_s)(r_r + j(2-s)\omega L_r)} + \frac{\mu^2}{3(j\mu\omega L_{ls} + r_f + \mu r_s)} \tag{5}$$

Here, Ypp is admittance of a positive phase sequence-positive phase sequence component, Ynn is admittance of a negative phase sequence-negative phase sequence component, Ypn is admittance of a positive phase sequence-negative phase sequence component, Ynp is admittance of a negative phase sequence-positive phase sequence component, Yn is negative-phase-sequence admittance, ω is a power supply angular velocity, rs is stator resistance, rr is rotor resistance, rf is short-circuit resistance, Ls is stator leakage inductance, Lr is rotor leakage inductance, Lm is excitation inductance, and μ is the short-circuit rate.

A non-diagonal component Ypn of the admittance Y can be used as an index for winding short-circuit, but it is not easy to calculate the non-diagonal component Ypn in an actual device. Therefore, here, a method of measuring and monitoring only negative-phase-sequence current Isn by analyzing normal-state data of initial negative-phase-sequence current Isn0, is adopted.

When winding short-circuit does not occur (μ=0), the non-diagonal component Ypn of the admittance Y is zero, and therefore the following is satisfied.

$$Isn = Yn \cdot Vsn = Isn0 \tag{6}$$

When winding short-circuit occurs, Isn changes as follows.

$$Isn = Yn \cdot Vsn + Ypn \cdot Vsp = Isn0 + Ypn \cdot Vsp \tag{7}$$

That is, with the initial negative-phase-sequence current Isn0 analyzed, only Isn and Isn0 are measured, and the following evaluation value A is used as an index.

$$\text{Evaluation value } A = |Isn - Isn0| \tag{8}$$

Thus, occurrence of winding short-circuit can be detected.

At the initial period when an electric motor is installed, initialization is performed (negative-phase-sequence admittance Yn is calculated) assuming that winding short-circuit has not occurred yet, and thereafter, the evaluation value A in Expression (8) is monitored to perform determination for winding short-circuit.

The abnormality determination unit 60 includes the winding short-circuit determination unit 61, and determines whether or not winding short-circuit has occurred on the basis of whether or not the evaluation value A calculated by the evaluation value analysis unit 51 exceeds a predetermined threshold δ1. The threshold δ1 is a value that differs depending on the rating of the electric motor 5. The threshold δ1 is an evaluation threshold.

The threshold δ1 is corrected by the inverter driving frequency. FIG. 6A illustrates an example in which abnormality of the electric motor cannot be detected in a case where the threshold δ1 is constant even when the inverter driving frequency is changed, and FIG. 6B illustrates an example in which detection for abnormality of the electric motor is enabled by changing the threshold δ1 when the inverter driving frequency is changed.

As shown in FIG. 6A, in a case where the threshold δ1 is constant irrespective of the inverter driving frequency, a situation in which layer short-circuit cannot be detected occurs when the inverter driving frequency is changed from 60 Hz to 40 Hz, for example. This is because change in negative-phase-sequence current due to layer short-circuit is small when the inverter driving frequency is low. Therefore, it is possible to prevent omission of detection for the winding short-circuit by changing the threshold from a threshold δ1*a* set when the inverter driving frequency is 60 Hz to a threshold δ1*b* when the inverter driving frequency is changed to 40 Hz.

The following Expression (9) shows that negative-phase-sequence current in a case of winding short-circuit changes depending on the inverter driving frequency. Here, fs is the inverter driving frequency calculated by the inverter driving frequency calculation unit, and fb is the power supply frequency (commercial frequency) as a reference. Even in a case of the same short-circuit rate, if the inverter driving frequency is small, change in negative-phase-sequence current is also small. This characteristic is relevant to V/f control. In general, in V/f control, when the inverter driving frequency fs is not greater than the power supply frequency fb (not greater than 60 Hz or not greater than 50 Hz), the voltage value changes. On the other hand, when the inverter driving frequency fs is not less than the power supply frequency fb (not less than 60 Hz or not less than 50 Hz), the voltage value is constant, and therefore in this frequency range, the threshold δ1 might not need to be corrected. It is preferable that whether or not to perform correction is changed depending on each inverter driving method.

[Mathematical 6]

$$I_{sn} = \frac{\left(\frac{f_s}{f_b}\right) \times \mu V_{sp,rated}}{\sqrt{\left\{\mu\left(1-\frac{2}{3}\mu\right)r_s + r_f\right\}^2 + \left(\frac{f_s}{f_b}\right)^2 \left\{\mu\left(1-\frac{2}{3}\mu\right)\right\}^2 (2\pi f_b L_{ls})^2}} \tag{9}$$

Here, the Vsp, rated is positive-phase-sequence voltage at the power supply frequency as a reference, and Lls is stator winding inductance.

An average value Isn0*av* and the standard deviation σ of initial negative-phase-sequence current are calculated in analysis on the initial negative-phase-sequence current, and therefore, as a simple way, the threshold δ1 may be set at Isn0*av*+3σ, Isn0*av*+4σ, or the like, for example.

Next, a process for diagnosis using the diagnosis device 100 for electric motor will be described with reference to FIG. 7 and FIG. 8.

Figure 7:
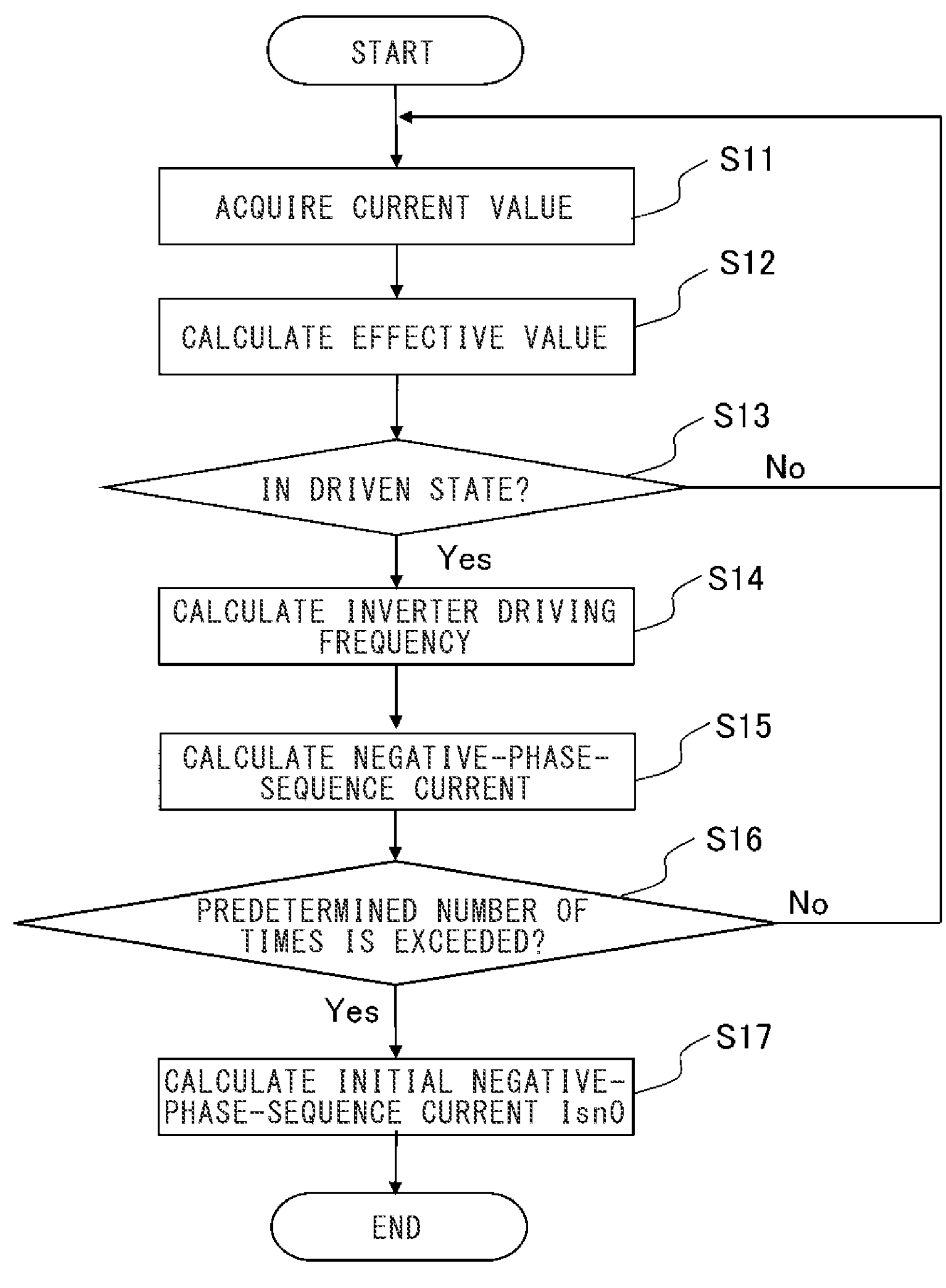
FIG. 7 is a flowchart for analyzing the initial negative-phase-sequence current using the diagnosis device for electric motor according to embodiment 1.

FIG. 7 is a flowchart for analyzing initial negative-phase-sequence current using the diagnosis device for electric motor according to embodiment 1. Current (current for each phase) of the electric motor 5 is acquired by the current detection circuit 7 (step S11), and the effective value calculation unit 21 calculates the effective value of the current (step S12). The driving state determination unit 41 determines whether or not the electric motor 5 is in a driven state, on the basis of the effective value of the current, and if it is determined that the electric motor 5 is in a driven state (Yes in step S13), the inverter driving frequency calculation unit 22 calculates the inverter driving frequency (step S14). Subsequently, the negative-phase-sequence current calculation unit 23 calculates negative-phase-sequence current (step S15). Whether or not the number of times the negative-phase-sequence current is calculated exceeds a predetermined number of times, is determined. If it is determined that the predetermined number of times is exceeded (Yes in step S16), the negative-phase-sequence current values for the predetermined number of times are averaged, and the averaged value is used as the initial negative-phase-sequence current value Isn0 in a normal state (step S17). At the same time, the standard deviation σ may be calculated. The initial negative-phase-sequence current value Isn0 is stored in the storage unit 11. If the number of times the negative-phase-sequence current is calculated is smaller than the predetermined number of times (No in step S16), current of the electric motor is acquired again to repeat processing from step S11 to step S16 until reaching the predetermined number of times.

After the initial negative-phase-sequence current value Isn0 is calculated, diagnosis for winding short-circuit determination is performed. The diagnosis for winding short-circuit determination is performed during driving of the electric motor.

Figure 8:
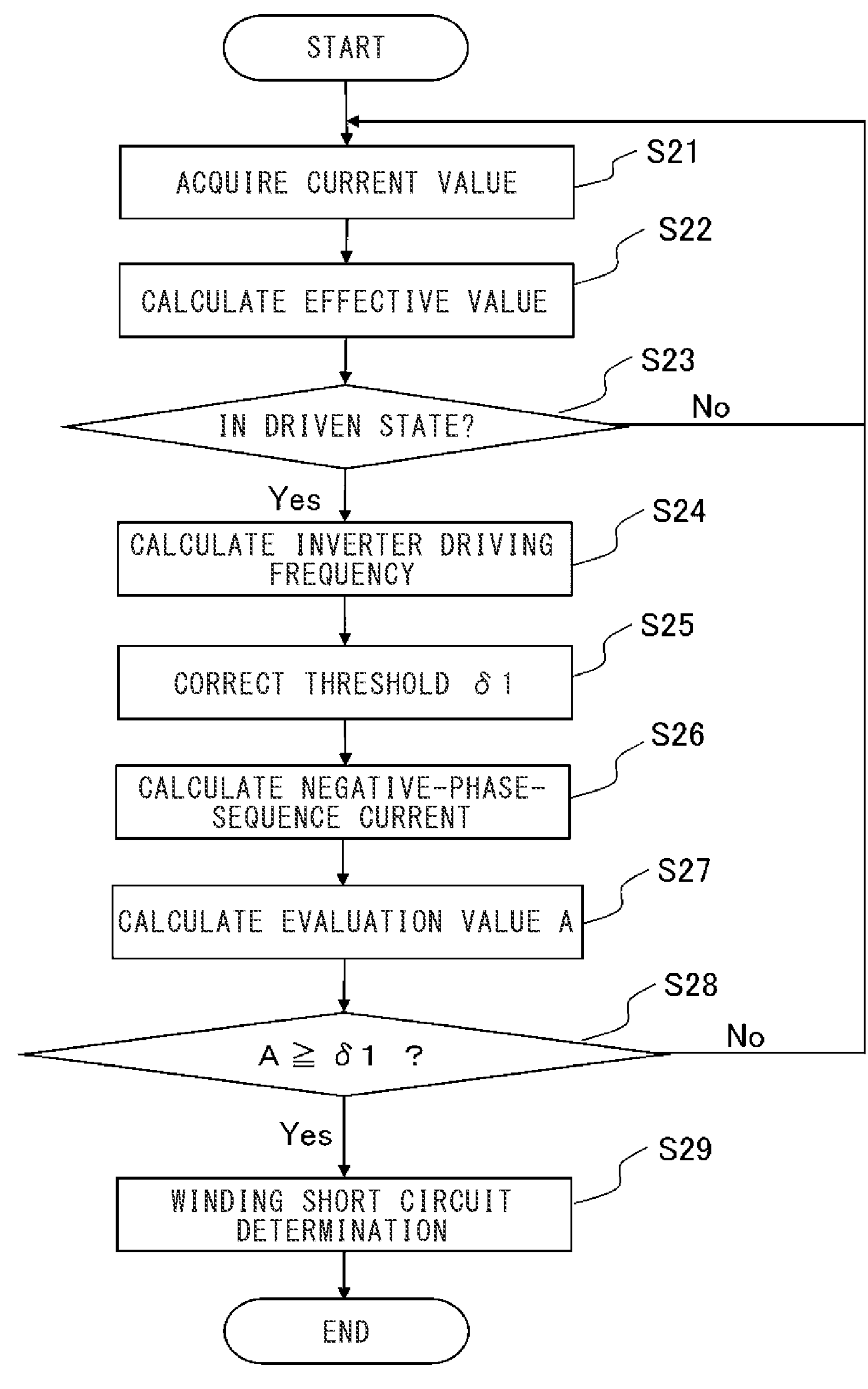
FIG. 8 is a flowchart for performing winding short-circuit determination using the diagnosis device for electric motor according to embodiment 1.

FIG. 8 is a flowchart for performing winding short-circuit determination. Current (current for each phase) of the electric motor 5 is acquired by the current detection circuit 7 (step S21), and the effective value calculation unit 21 calculates the effective value of the current (step S22). The driving state determination unit 41 determines whether or not the electric motor 5 is in a driven state, on the basis of the effective value of the current, and if it is determined that the electric motor 5 is in a driven state (Yes in step S23), the inverter driving frequency calculation unit 22 calculates the inverter driving frequency (step S24). The predetermined threshold δ1 is corrected on the basis of the calculated inverter driving frequency (step S25). Since the threshold δ1 changes by the inverter driving frequency, thresholds for respective inverter driving frequencies may be prepared in a map form and stored as a database. Subsequently, the negative-phase-sequence current calculation unit 23 calculates the negative-phase-sequence current Isn (step S26).

Next, the evaluation value analysis unit 51 calculates the evaluation value A in Expression (8) from the initial negative-phase-sequence current Isn0 calculated in step S16 in FIG. 7 and stored in the storage unit 11 and the negative-phase-sequence current Isn calculated in step S26 (step S27). The winding short-circuit determination unit 61 compares the evaluation value A and the threshold 81 corrected in step S25. If A≥δ1 is satisfied (Yes in step S28), the winding short-circuit determination unit 61 determines that winding short-circuit has occurred, and outputs the result to outside (step S29).

In a case of A<δ1 in step S28, the process returns to step S21 to acquire current (current for each phase) of the electric motor 5 again. In a case where there is no change in the inverter driving frequency calculated in step S24, correction for the threshold δ1 is not performed in step S25, and the process proceeds to step S26.

As described above, in embodiment 1, a difference from the initial value of the negative-phase-sequence current is used as the evaluation value A for winding short-circuit, and determination for winding short-circuit is performed through comparison between the evaluation value A and the predetermined threshold δ1. At this time, the difference from the initial negative-phase-sequence current corresponding to the inverter driving frequency during driving when the negative-phase-sequence current is calculated is used. Therefore, the initial state can be offset and negative-phase-sequence admittance is not calculated. Thus, it is possible to accurately detect short-circuit failure in the stator windings of the electric motor driven by the inverter. In addition, since a voltage detection circuit is not needed, it becomes possible to provide a diagnosis device for electric motor capable of accurately detecting short-circuit failure in stator windings of an electric motor while suppressing power consumption, with a simple configuration.

Further, in a case where the inverter driving frequency is changed during driving, the evaluation value A is compared with the threshold δ1 obtained by correcting the predetermined threshold δ1 in accordance with the inverter driving frequency or the current effective value, to perform determination for winding short-circuit. Thus, omission of detection for short-circuit failure in the stator windings of the electric motor driven by the inverter can be suppressed.

In the present embodiment, it is assumed that the voltage imbalance rate is small. This is because, if the voltage imbalance rate is great, the negative-phase-sequence current value changes depending on variation in load torque, and thus there is a high possibility that erroneous detection occurs in winding short-circuit determination. In a system used in the control center which is an enclosed switchboard, exemplified in the present embodiment, the magnitude of the voltage imbalance rate can be selected in advance on the basis of load balance. In the present embodiment, a system having a small voltage imbalance rate as selected can be adopted. Alternatively, as described later, measurement for the voltage imbalance rate may be performed in parallel, or the value thereof may be acquired in advance, and then whether or not the present embodiment is applicable may be determined.

Embodiment 2

Hereinafter, a diagnosis device for electric motor according to embodiment 2 will be described with reference to FIG. 9 to FIG. 14.

Figure 9:
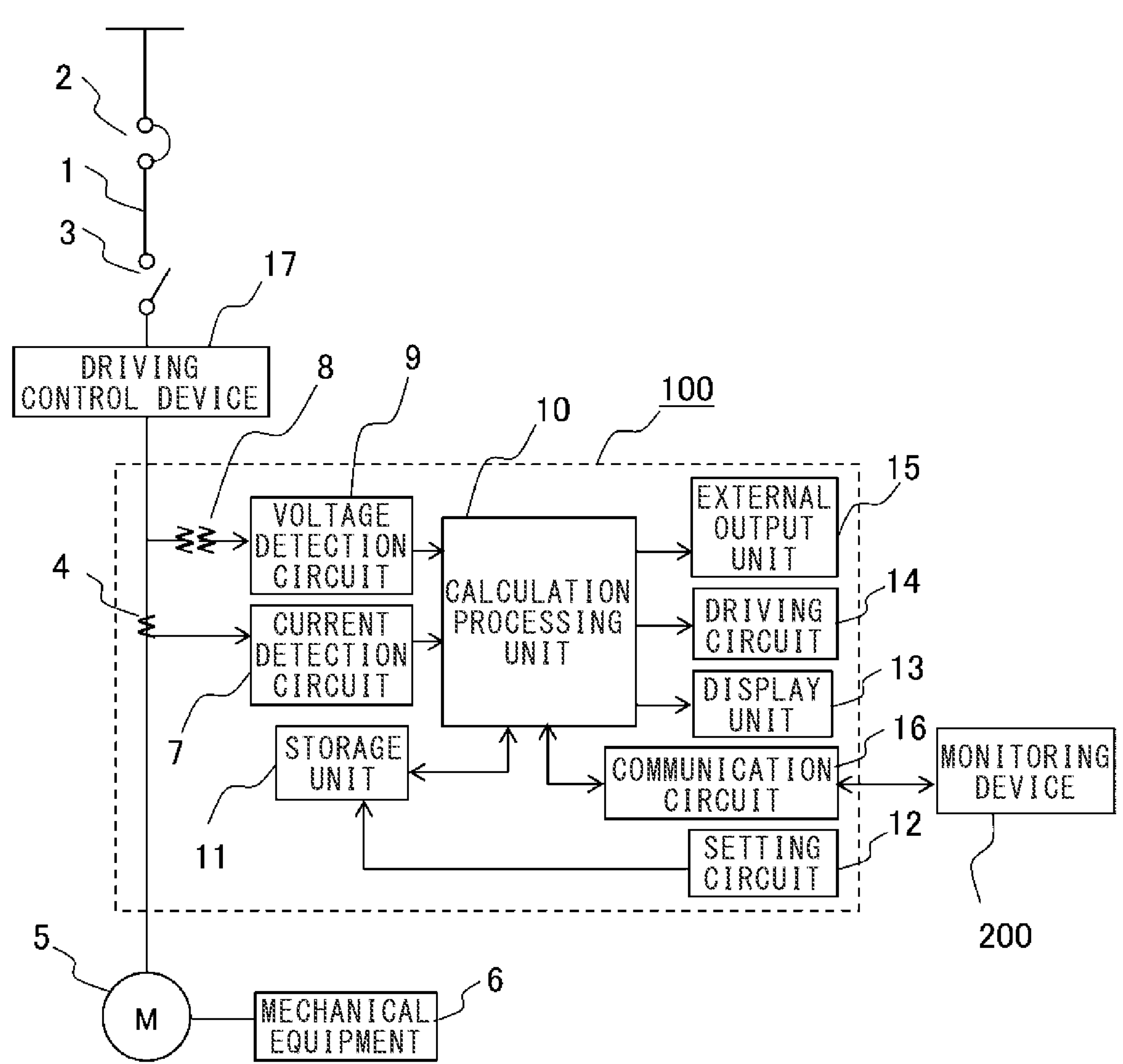
FIG. 9 is a circuit configuration diagram showing a diagnosis device for electric motor according to embodiment 2.

FIG. 9 is a circuit configuration diagram showing a diagnosis device for electric motor according to embodiment 2, and the difference from embodiment 1 is that the main circuit 1 is provided with an instrument voltage transformer 8 for detecting voltage of the main circuit 1, and the diagnosis device 100 for electric motor is provided with a voltage detection circuit 9 connected to the instrument voltage transformer 8. The other configurations are the same as those in embodiment 1.

The voltage detection circuit 9 detects line-to-line voltage of the main circuit 1 of the power supply connected to the electric motor 5, converts this to a predetermined signal such as phase voltage of the electric motor 5, to detect voltage of the electric motor 5, and outputs the signal to the calculation processing unit 10 and the storage unit 11.

The calculation processing unit 10 receives outputs of the current detection circuit 7 and the voltage detection circuit 9, and calculates negative-phase-sequence current, a voltage imbalance rate, and the like through analysis on voltage and current of the electric motor 5, to perform determination and detection for winding short-circuit during operation of the electric motor.

The diagnosis device 100 for electric motor according to the present embodiment 2 also has such hardware as shown in FIG. 2.

Figure 10:
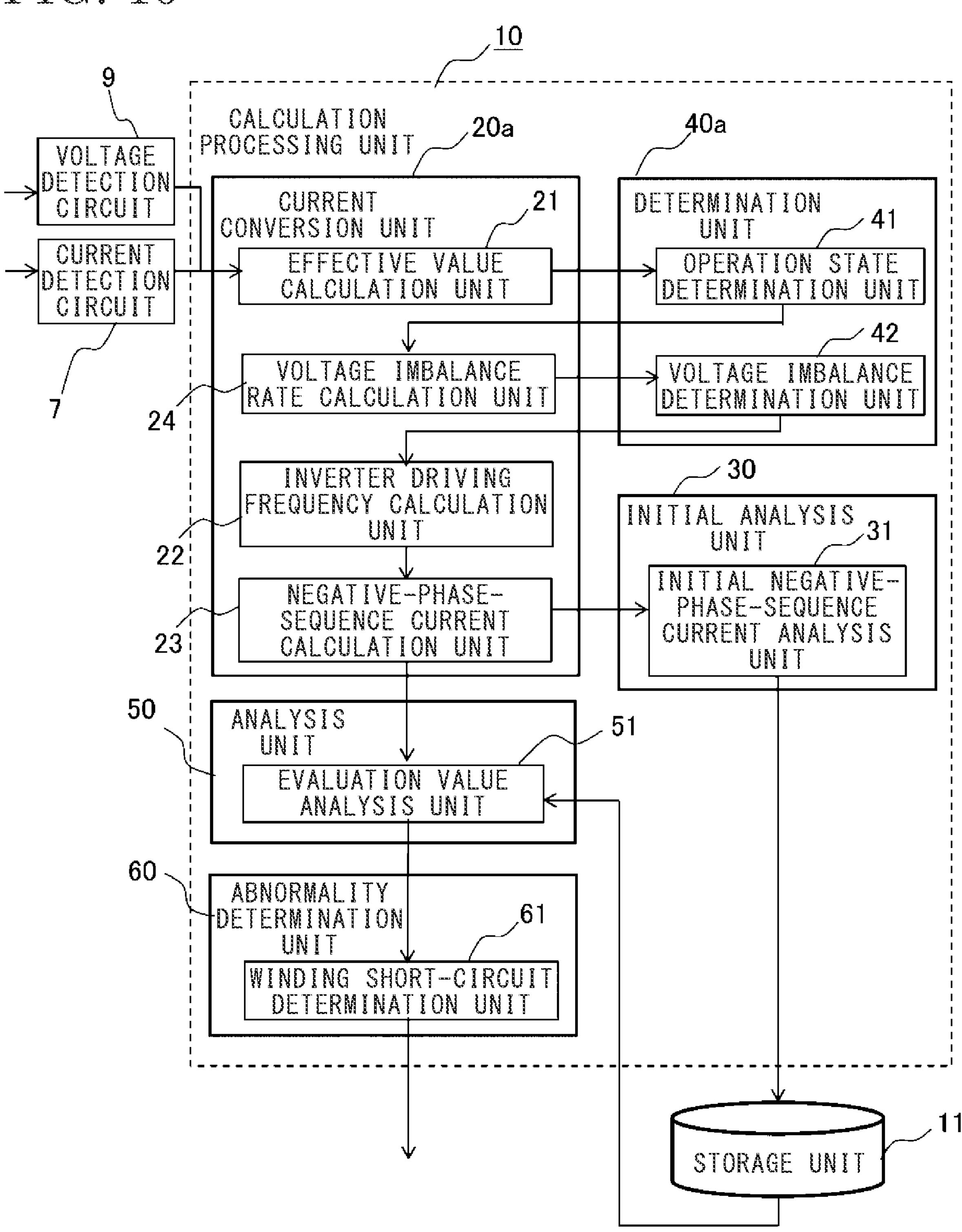
FIG. 10 is a configuration diagram of a calculation processing unit of the diagnosis device for electric motor according to embodiment 2.

FIG. 10 is a configuration diagram schematically showing the calculation processing unit 10 in the diagnosis device for electric motor according to embodiment 2. The calculation processing unit 10 includes a current voltage conversion unit 20*a*, the initial analysis unit 30, a determination unit 40*a*, the analysis unit 50, and the abnormality determination unit 60.

The current voltage conversion unit 20*a* includes the effective value calculation unit 21, the inverter driving frequency calculation unit 22, the negative-phase-sequence current calculation unit 23, and a voltage imbalance rate calculation unit 24, and calculates negative-phase-sequence current Isn by Expression (1) described in embodiment 1 through symmetric coordinate conversion processing on the basis of three-phase currents detected by the current detection circuit 7.

The voltage imbalance rate calculation unit 24 calculates a voltage imbalance rate Vunbal, using phase voltages for the respective phases or line-to-line voltages. In the case of calculating the voltage imbalance rate Vunbal from, for example, line-to-line voltages, the following expression is used.

$$V_{unbal} = ((\text{greatest difference between line-to-line voltages and average voltage})/\text{average voltage}) \times 100\%$$

That is, Vunbal is the greatest one of the following:

$$(Vuv-Vavg)/Vavg\times 100\%$$

$$(Vvw-Vavg)/Vavg\times 100\%$$

$$(Vwu-Vavg)/Vavg\times 100\%$$

Here, average voltage Vavg=(Vuv+Vvw+Vwu)/3.

In addition, Vuv is line-to-line voltage between phase u and phase v, Vvw is line-to-line voltage between phase v and phase w, and Vwu is line-to-line voltage between phase w and phase u.

In the voltage imbalance rate calculation unit 24, it is preferable that the negative-phase-sequence current is calculated only when the voltage imbalance rate Vunbal is not greater than 1%, and the negative-phase-sequence current is not calculated when the voltage imbalance rate is greater than 1%. This is because, if the voltage imbalance rate is great, the negative-phase-sequence current value changes depending on variation in load torque, and therefore there is a high possibility that erroneous detection occurs in winding short-circuit determination. Also for short-circuit determination, limitation is set so that the determination is performed only when the voltage imbalance rate is not greater than, for example, 1%, whereby winding short-circuit determination accuracy can be enhanced.

The initial analysis unit 30 includes an initial negative-phase-sequence current analysis unit 31. The initial negative-phase-sequence current analysis unit 31 analyzes a negative-phase-sequence current value Isn in a normal state before winding short-circuit determination. As in embodiment 1, for example, negative-phase-sequence current values for one month are calculated, and an averaged value thereof is used as an initial negative-phase-sequence current value Isn0. At the same time, a standard deviation σ may be calculated to find dispersion.

At this time, the initial negative-phase-sequence current value Isn0 is stored in the storage unit 11 together with the inverter driving frequency and the voltage imbalance rate. For example, as shown in FIG. 11, the initial negative-phase-sequence current values in respective ranges of inverter driving frequencies are stored in a map form for each range of voltage imbalance rates. The reason therefor is that the negative-phase-sequence current changes depending on each inverter driving frequency and each voltage imbalance rate. The initial negative-phase-sequence current value may be stored for each voltage imbalance rate and for each voltage effective value or each positive-phase-sequence voltage acquired by a voltage detector. This is because the change amount of the negative-phase-sequence current changes depending on the voltage effective value and the positive-phase-sequence voltage. FIG. 12 shows a relationship of the initial negative-phase-sequence current values in respective ranges of voltage effective values for each range of voltage imbalance rates. Such a relationship is stored in the storage unit 11. In FIG. 11, a range of inverter driving frequencies is defined as 5 (Hz) or more and less than 10 (Hz), for example, and in FIG. 12, a range of voltage effective values is defined as 100 (V) or more and less than 110 (V), for example.

The determination unit 40*a* includes the operation state determination unit 41 and a voltage imbalance determination unit 42. The driving state determination unit 41 determines the driving state of the electric motor on the basis of the effective values of current and voltage calculated by the effective value calculation unit 21. Determination for the driving state of the electric motor may be performed on the basis of the instantaneous value of current or voltage or an ON/OFF signal of the electromagnetic contactor 3, instead of the effective values of current and voltage.

The voltage imbalance determination unit 42 determines whether or not the voltage imbalance rate Vunbal is greater than a predetermined threshold δ2. The threshold δ2 is set at, for example, 1% as described above. The threshold δ2 is a voltage imbalance rate threshold.

The analysis unit 50 includes an evaluation value analysis unit 51, and performs analysis for determination to be performed in the winding short-circuit determination unit 61 of the abnormality determination unit 60. The evaluation value analysis unit 51 calculates the evaluation value A=|Isn−Isn0| in Expression (8). The calculation method for the evaluation value A is the same as in embodiment 1, and the negative-phase-sequence current Isn and the initial negative-phase-sequence current Isn0 calculated under the same inverter driving frequency are used.

That is, with the initial negative-phase-sequence current Isn0 analyzed, only Isn and Isn0 are measured, and the evaluation value A is used as an index, whereby occurrence of winding short-circuit can be detected.

At this time, by being limited to the case where the voltage imbalance rate Vunbal is not greater than, for example, 1%, detection can be accurately performed. In addition, at the initial period when the electric motor 5 is installed, initialization is performed (negative-phase-sequence admittance Yn is calculated) assuming that winding short-circuit has not occurred yet, and thereafter, the evaluation value A in Expression (8) is monitored to perform determination for winding short-circuit.

The configuration of the abnormality determination unit 60 is the same as that in embodiment 1, i.e., the winding short-circuit determination unit 61 is provided and determines whether or not winding short-circuit has occurred on the basis of whether or not the evaluation value A calculated by the evaluation value analysis unit 51 exceeds the predetermined threshold δ1.

The threshold δ1 is corrected by the inverter driving frequency, the voltage effective value, or the positive-phase-sequence voltage. The reason for the correction is that, as shown in Expression (9) and as described above, the negative-phase-sequence current in a case of winding short-circuit changes depending on the inverter driving frequency, the voltage effective value, and the positive-phase-sequence voltage value.

As in embodiment 1, the average value Isn0*av* and the standard deviation σ of initial negative-phase-sequence current are calculated in analysis on the initial negative-phase-sequence current, and therefore, as a simple way, the threshold δ1 may be set at Isn0*av*+3σ, Isn0*av*+4σ, or the like, for example.

Next, a process for diagnosis using the diagnosis device 100 for electric motor will be described with reference to FIG. 13 and FIG. 14.

Figure 13:
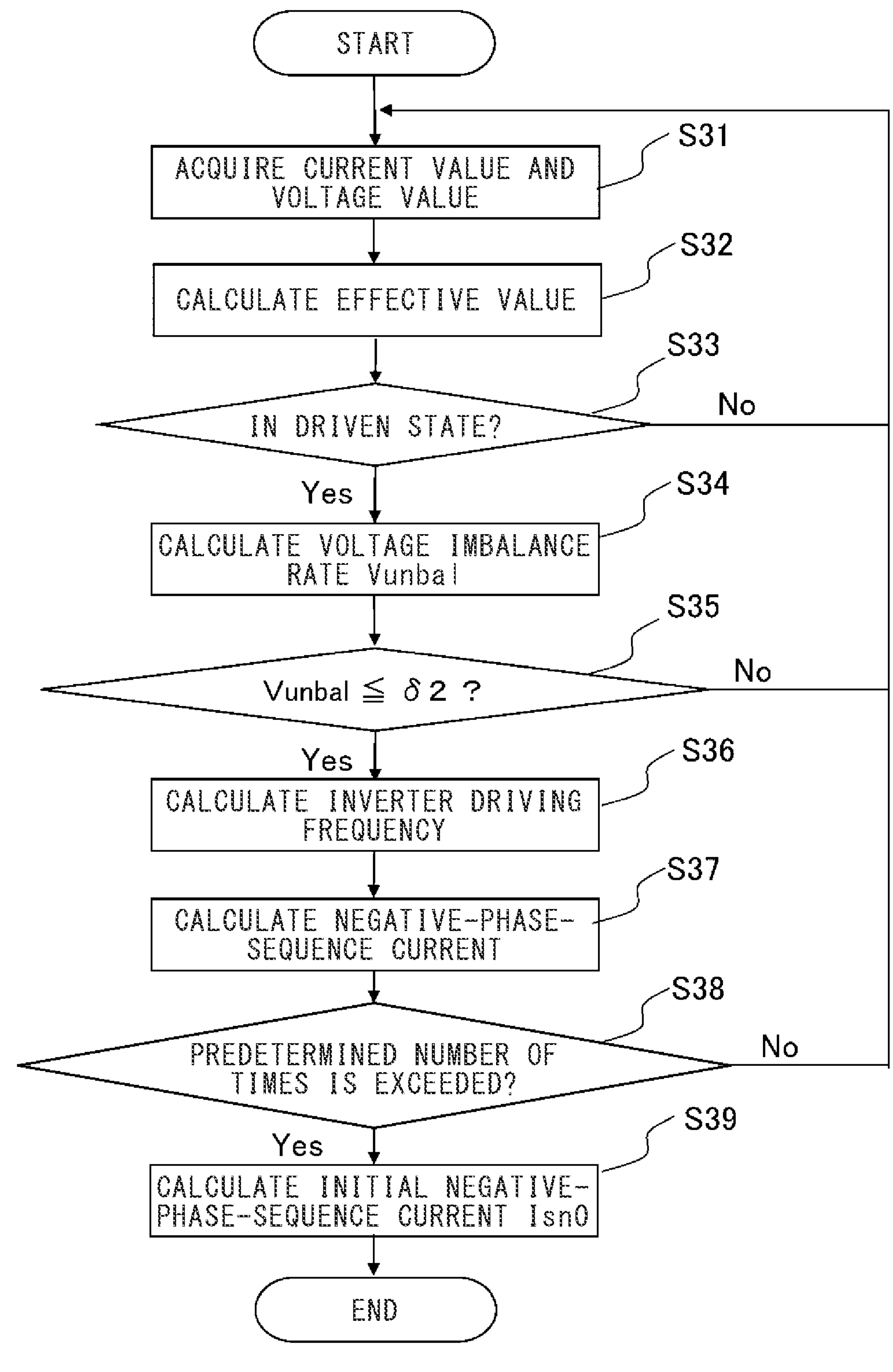
FIG. 13 is a flowchart for analyzing the initial negative-phase-sequence current using the diagnosis device for electric motor according to embodiment 2.

FIG. 13 is a flowchart for analyzing initial negative-phase-sequence current using the diagnosis device for electric motor according to embodiment 2. Current (current for each phase) of the electric motor 5 is acquired by the current detection circuit 7, and voltage (line-to-line voltage or phase voltage) of the electric motor 5 is acquired by the voltage detection circuit 9 (step S31). The effective value calculation unit 21 calculates the effective values of the current and the voltage (step S32). The driving state determination unit 41 determines whether or not the electric motor 5 is in a driven state, on the basis of the effective values of the current and the voltage. If it is determined that the electric motor 5 is in a driven state (Yes in step S33), the voltage imbalance rate calculation unit 24 calculates the voltage imbalance rate Vunbal (step S34).

The voltage imbalance rate Vunbal is compared with the predetermined threshold δ2, and if voltage imbalance rate Vunbal≤δ2 is satisfied (Yes in step S35), the inverter driving frequency calculation unit 22 calculates the inverter driving frequency (step S36). Subsequently, the negative-phase-sequence current calculation unit 23 calculates negative-phase-sequence current (step S37). Whether or not the number of times the negative-phase-sequence current is calculated exceeds a predetermined number of times, is determined. If it is determined that the predetermined number of times is exceeded (Yes in step S38), the negative-phase-sequence current values for the predetermined number of times are averaged, and the averaged value is used as the initial negative-phase-sequence current value Isn0 (step S39). At the same time, the standard deviation σ may be calculated. The initial negative-phase-sequence current value Isn0 is stored in the storage unit 11. If the number of times the negative-phase-sequence current is calculated is smaller than the predetermined number of times (No in step S38), current of the electric motor is acquired again to repeat processing from step S31 to step S38 until reaching the predetermined number of times.

After the initial negative-phase-sequence current value Isn0 is calculated, diagnosis for winding short-circuit determination is performed.

Figure 14:
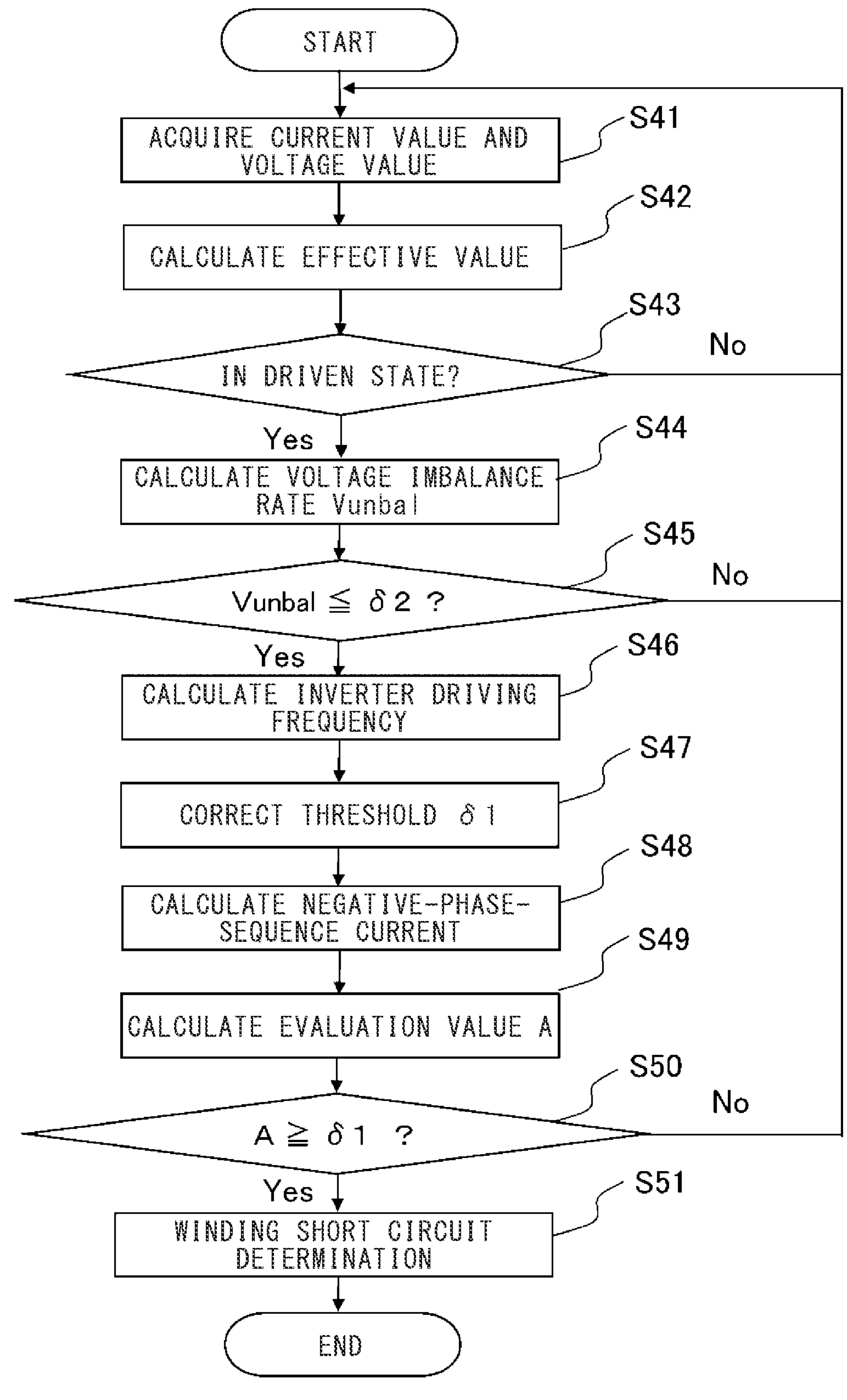
FIG. 14 is a flowchart for performing winding short-circuit determination using the diagnosis device for electric motor according to embodiment 2.

FIG. 14 is a flowchart for performing winding short-circuit determination. Current (current for each phase) of the electric motor 5 is acquired by the current detection circuit 7, and voltage (line-to-line voltage or phase voltage) of the electric motor 5 is acquired by the voltage detection circuit 9 (step S41). The effective value calculation unit 21 calculates the effective values of the current and the voltage (step S42). The driving state determination unit 41 determines whether or not the electric motor 5 is in a driven state, on the basis of the effective values of the current and the voltage. If it is determined that the electric motor 5 is in a driven state (Yes in step S43), the voltage imbalance rate calculation unit 24 calculates the voltage imbalance rate Vunbal (step S44).

The voltage imbalance rate Vunbal is compared with the predetermined threshold δ2, and if voltage imbalance rate Vunbal≤δ2 is satisfied (Yes in step S45), the inverter driving frequency calculation unit 22 calculates the inverter driving frequency (step S46). The predetermined threshold δ1 is corrected on the basis of the inverter driving frequency calculated in step S46, the voltage effective value calculated in step S42, or the positive-phase-sequence voltage (step S47). Subsequently, the negative-phase-sequence current calculation unit 23 calculates the negative-phase-sequence current Isn (step S48).

Next, the evaluation value analysis unit 51 calculates the evaluation value A in Expression (8) from the initial negative-phase-sequence current Isn0 calculated in step S39 in FIG. 13 and stored in the storage unit 11 and the negative-phase-sequence current Isn calculated in step S48 (step S49). The winding short-circuit determination unit 61 compares the evaluation value A and the threshold δ1 corrected in step S47. If A≥δ1 is satisfied (Yes in step S50), the winding short-circuit determination unit 61 determines that winding short-circuit has occurred, and outputs the result to outside (step S51).

In a case of A<δ1 in step S50, the process returns to step S41 to acquire current (current for each phase) and voltage (line-to-line voltage or phase voltage) of the electric motor 5 again. In a case where there is no change in the inverter driving frequency calculated in step S46, correction for the threshold δ1 is not performed in step S47, and the process proceeds to step S48. Alternatively, in a case where there is no change in the inverter driving frequency calculated in step S46, the same threshold δ1 is set again in step S47, and the process proceeds to step S48.

As described above, embodiment 2 provides the same effects as those in embodiment 1. Further, in a case where the voltage imbalance rate Vunbal is unknown or estimated to be great, the voltage imbalance rate Vunbal is calculated, and if the voltage imbalance rate Vunbal is greater than the predetermined threshold δ2, e.g., 1%, short-circuit determination based on the negative-phase-sequence current is not performed. Thus, error in short-circuit determination is suppressed. As a matter of course, if the calculated voltage imbalance rate Vunbal is smaller than the predetermined threshold δ2, winding short-circuit determination is performed in accordance with the flowcharts shown in FIG. 13 and FIG. 14.

Embodiment 3

Hereinafter, a diagnosis device for electric motor according to embodiment 3 will be described.

Figure 15:
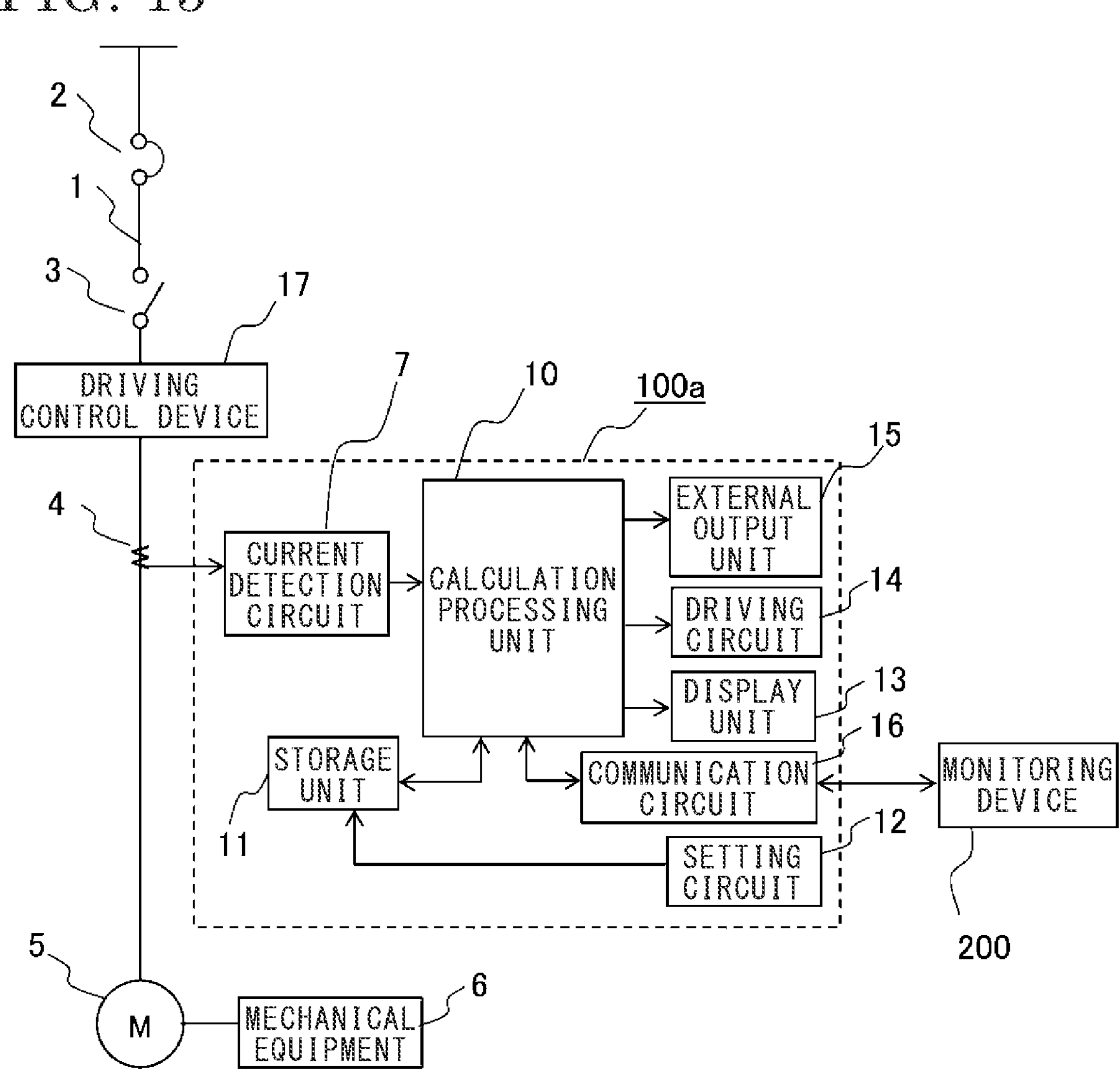
FIG. 15 is a circuit configuration diagram showing a diagnosis device for electric motor according to embodiment 3.

FIG. 15 is a circuit configuration diagram showing a diagnosis device 100*a* for electric motor according to embodiment 3. The difference from embodiment 1 is that the configuration shown in embodiment 1 is in a form of a control center, whereas in embodiment 3, the instrument transformer 4 for detecting current of the main circuit 1 is, for example, a clamp type and thus is configured to be attachable to the main circuit as appropriate. With this configuration, it becomes possible to attach the diagnosis device 100*a* for electric motor to each switchboard. That is, an externally attachable device can be obtained.

Figure 16:
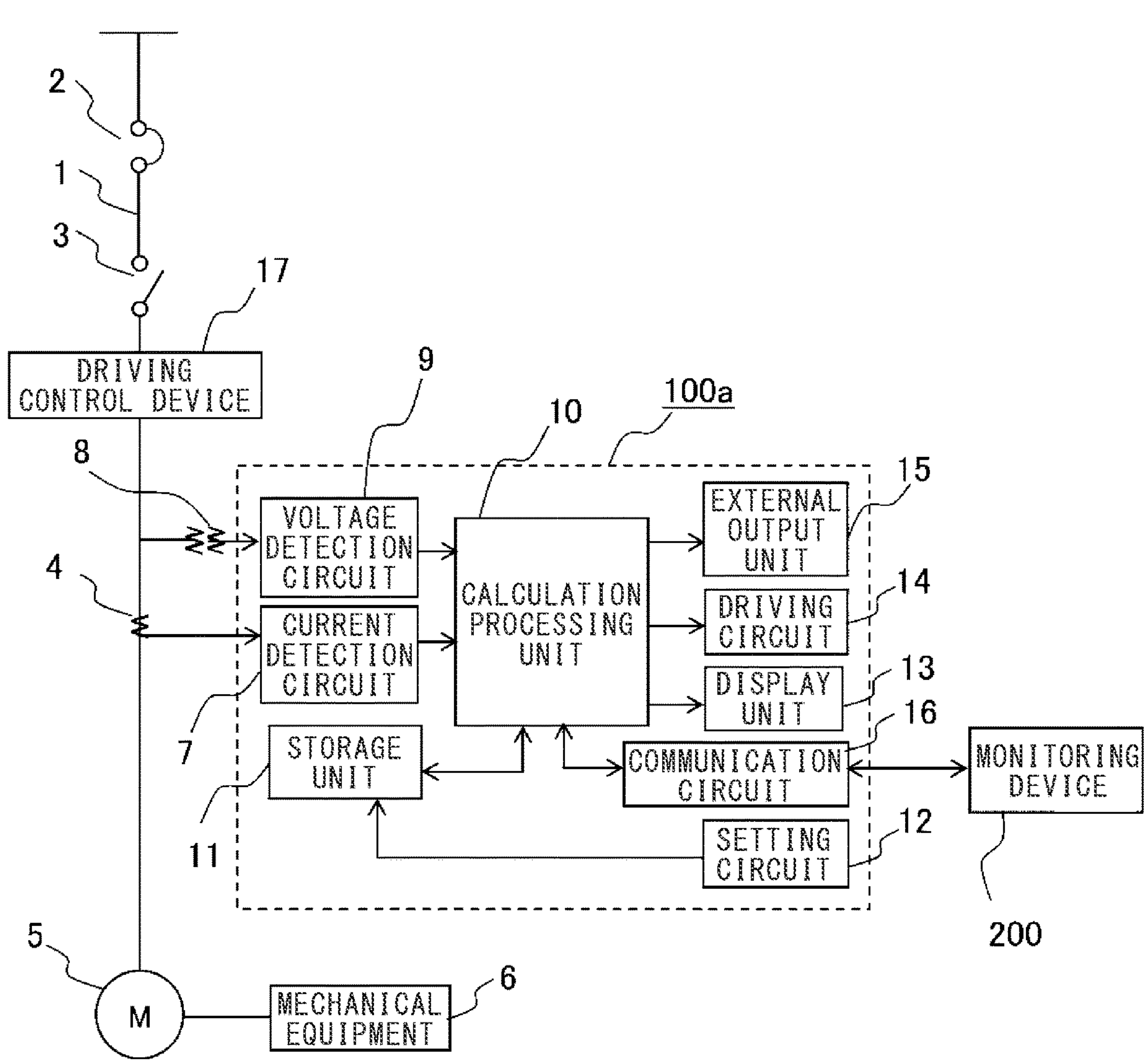
FIG. 16 is a circuit configuration diagram showing another diagnosis device for electric motor according to embodiment 3.

FIG. 16 is a circuit configuration diagram showing another diagnosis device 100*a* for electric motor according to embodiment 3. In FIG. 16, the difference from embodiment 2 is that the instrument transformer 4 for detecting current of the main circuit 1 and the instrument voltage transformer 8 for detecting voltage of the main circuit 1 are, for example, a clamp type and thus are configured to be attachable to the main circuit as appropriate. With this configuration, it becomes possible to attach the diagnosis device 100*a* for electric motor to each switchboard. That is, an externally attachable device can be obtained.

As described above, according to embodiment 3, the effects in embodiment 1 are provided, and in addition, the diagnosis device 100*a* for electric motor can be configured independently and can be attached to the main circuit to which the electric motor is connected, as necessary.

Embodiment 4

Hereinafter, a diagnosis device for electric motor according to embodiment 4 will be described.

Figure 17:
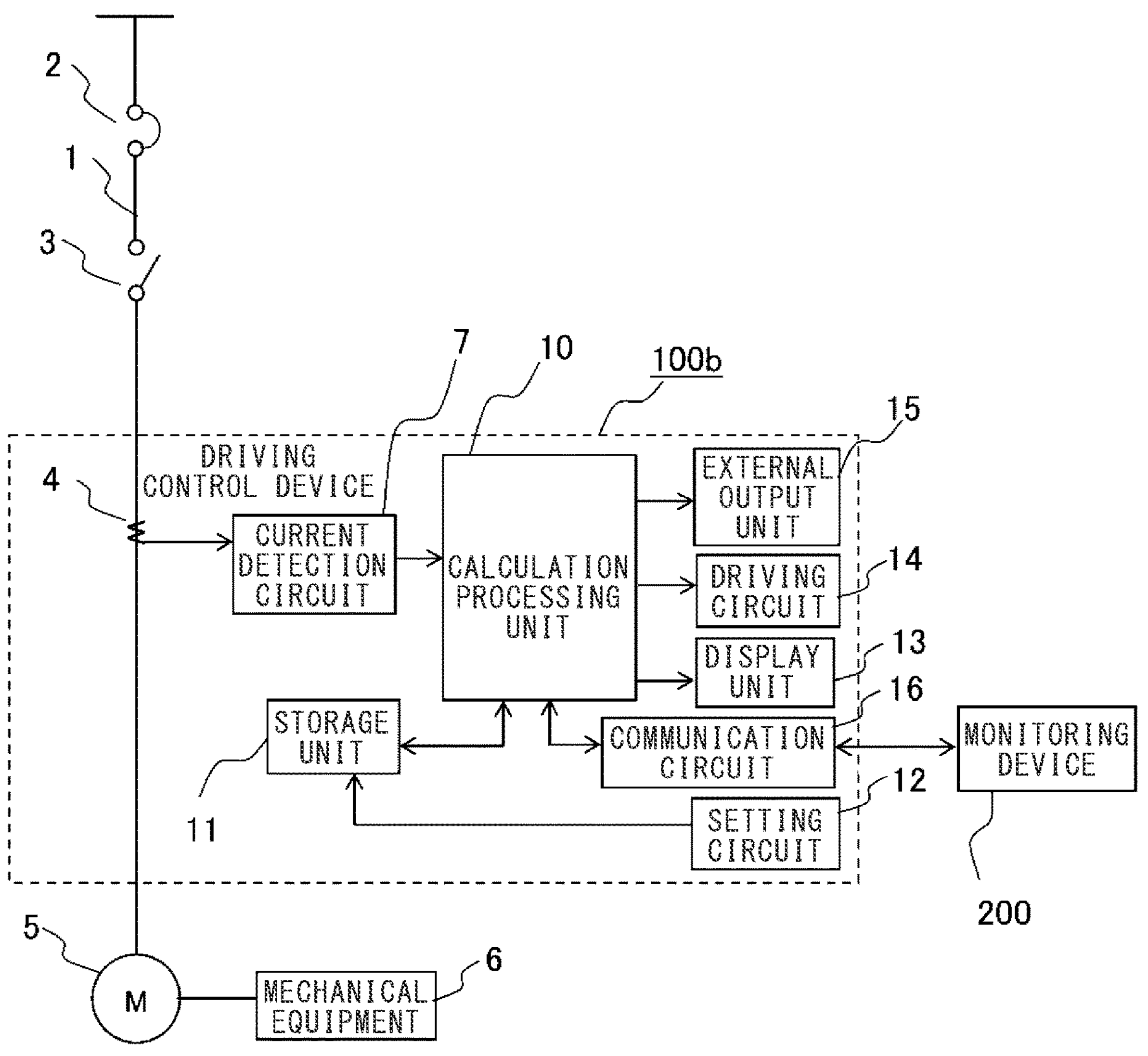
FIG. 17 is a circuit configuration diagram showing a diagnosis device for electric motor according to embodiment 4.

FIG. 17 is a circuit configuration diagram showing a diagnosis device 100*b* for electric motor according to embodiment 4. In embodiment 1, the diagnosis device 100 for electric motor is provided independently of the driving control device 17, whereas the diagnosis device 100*b* for electric motor according to the present embodiment 4 is configured such that an electric motor diagnosis function is incorporated in a driving control device. For example, the diagnosis function is imparted to a microcomputer of a driving control device, thus forming a diagnosis device incorporated in the driving control device.

Figures 18, 19:
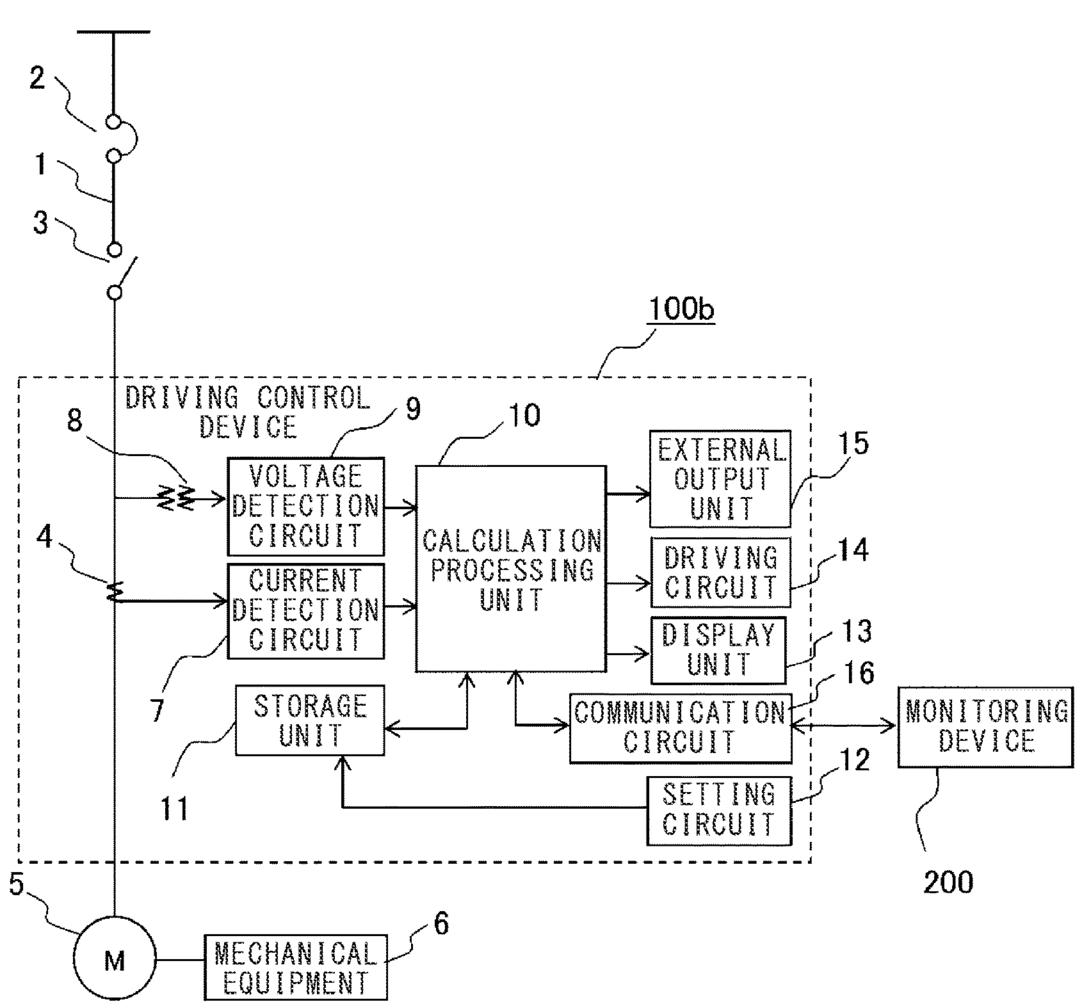
FIG. 18 is a circuit configuration diagram showing another diagnosis device for electric motor according to embodiment 4.
FIG. 19 shows a configuration of an abnormality indication inference device for electric motor according to embodiment 5.

FIG. 18 is a circuit configuration diagram showing another diagnosis device 100*b* for electric motor according to embodiment 4. FIG. 18 shows an example in which the function of the diagnosis device for electric motor of embodiment 2 is incorporated in the driving control device. Also in this case, the diagnosis function is imparted to a microcomputer of a driving control device, thus forming a diagnosis device incorporated in the driving control device.

As described above, according to embodiment 4, the effects in embodiment 1 are provided, and in addition, a configuration integrated with a driving device can be realized, whereby the device size can be reduced.

Embodiment 5

Hereinafter, an abnormality indication diagnosis device for electric motor according to embodiment 5 will be described.

The abnormality indication inference device of the present embodiment 5 may be added to any of the diagnosis devices 100, 100*a*, 100*b* for electric motor of embodiments 1 to 4 described above. The abnormality indication inference device may be incorporated in the diagnosis device for electric motor, incorporated in the external monitoring device 200, or externally attached to the monitoring device 200.

FIG. 19 shows a configuration of the abnormality indication diagnosis device for electric motor according to the present embodiment 5, which is added to any of the diagnosis devices 100, 100*a*, 100*b* for electric motor. In FIG. 19, an abnormality indication inference device 300 for electric motor includes a learning device 310 and an inference device 320. Hereinafter, a procedure for inferring an abnormality indication of an electric motor will be described separately in a "learning phase" and in a "usage phase" for actually performing inference.

<Learning Phase>

Figure 20:
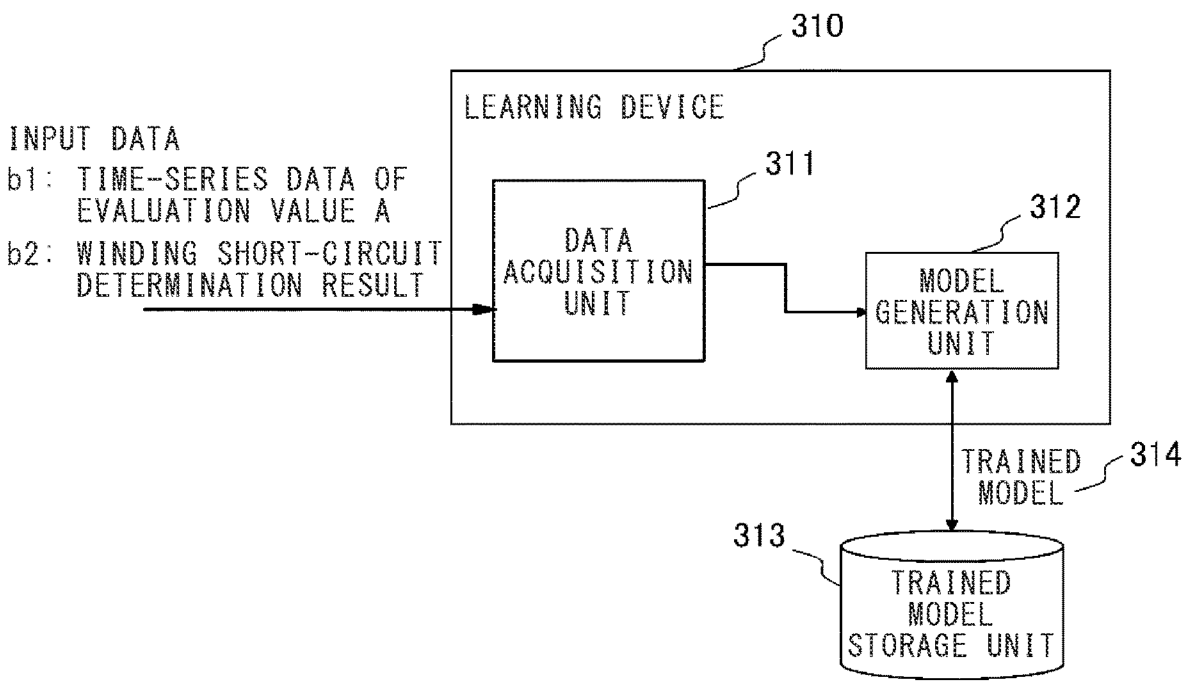
FIG. 20 shows a configuration of a learning device of the abnormality indication inference device for electric motor according to embodiment 5.

FIG. 20 shows a configuration of the learning device 310. The learning device 310 includes a data acquisition unit 311, a model generation unit 312, and a trained model storage unit 313.

Figure 21:
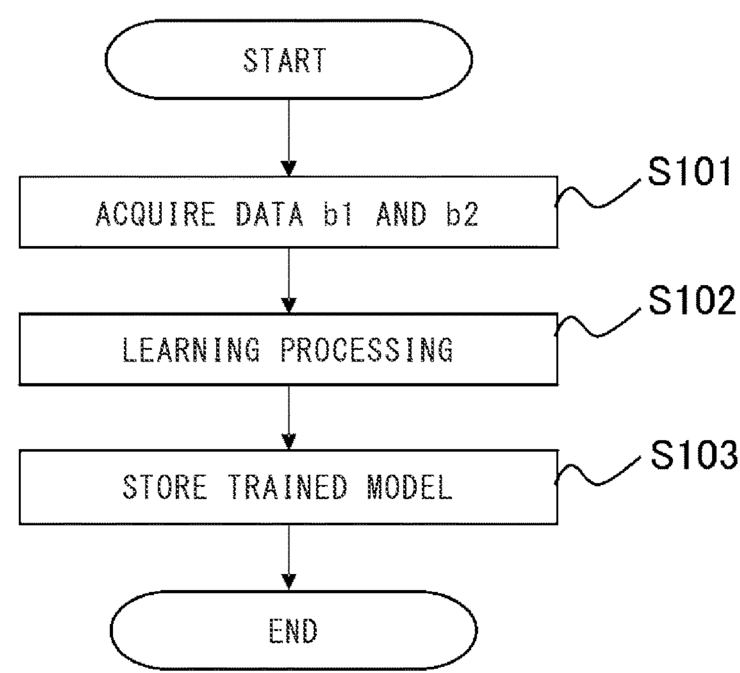
FIG. 21 is a flowchart for performing learning using the learning device shown in FIG. 20.

FIG. 21 is a flowchart showing a processing procedure for executing the learning phase using the learning device 310.

The data acquisition unit 311 acquires, as input data, time-series data b1 of the evaluation value A and a winding short-circuit determination result b2, from the diagnosis device for electric motor, and combines and associates the time-series data b1 and the determination result b2 with each other to obtain training data (step S101).

The model generation unit 312 learns abnormality indications of an electric motor on the basis of the training data outputted from the data acquisition unit 311 (step S102). That is, on the basis of the time-series data of a plurality of evaluation values A over a certain period before it is determined that there is winding short-circuit abnormality, the model generation unit 312 learns a time-series pattern that appears in common for abnormality determination, to generate a trained model 314. For learning to generate the trained model 314, the following method can be used: a time-series pattern that appears in common for abnormality determination and is not included in a time-series pattern in a case of normality determination is inferred through deep learning on the basis of the time-series data of a plurality of evaluation values A over a certain period before it is determined that there is winding short-circuit abnormality. Alternatively, a known machine learning method such as genetic programming, inductive programming, or a support vector machine may be used.

By executing learning as described above, the model generation unit 312 generates and outputs the trained model 314, and the trained model storage unit 313 stores the trained model 314 outputted from the model generation unit 312 (step S103).

<Usage Phase>

Figure 22:
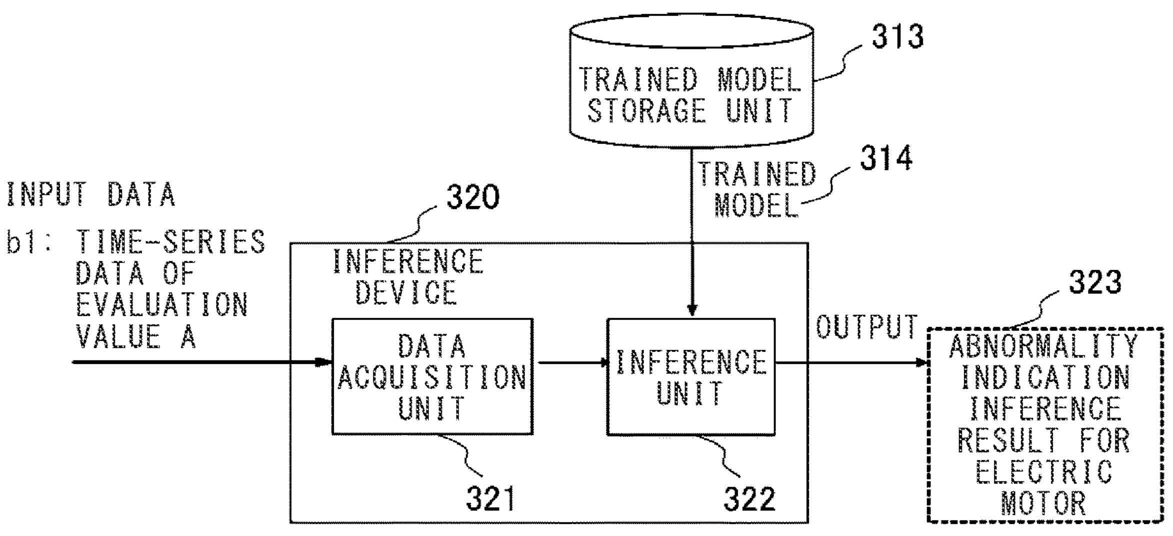
FIG. 22 shows a configuration of an inference device of the abnormality indication inference device for electric motor according to embodiment 5.

FIG. 22 shows a configuration of the inference device 320. The inference device 320 includes a data acquisition unit 321 and an inference unit 322.

Figure 23:
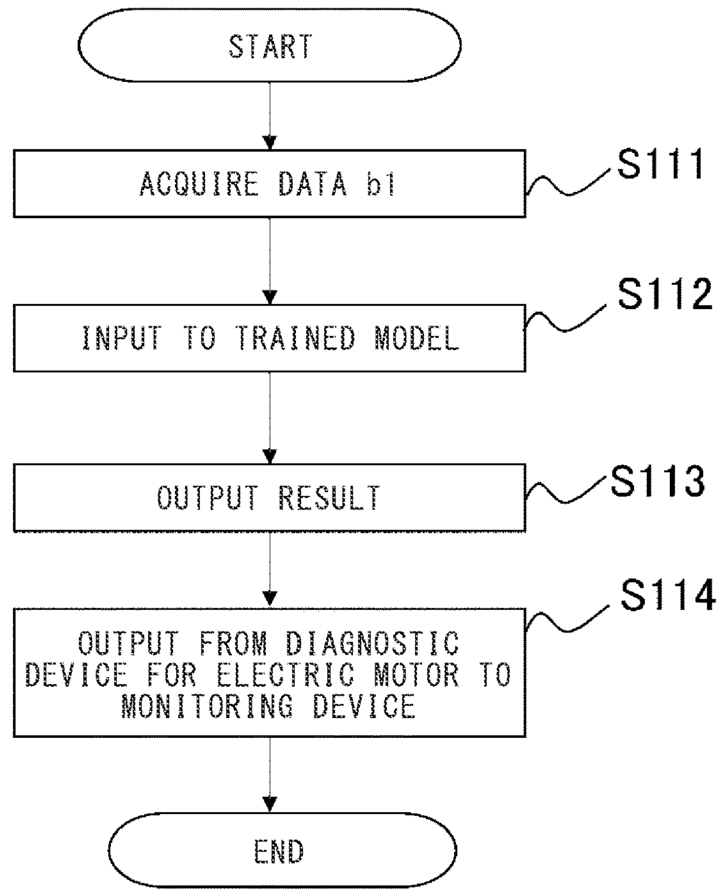
FIG. 23 is a flowchart for inferring abnormality indication of an electric motor using the inference device shown in FIG. 22.

FIG. 23 is a flowchart showing a processing procedure for executing the usage phase in which an abnormality indication of the electric motor is inferred using the inference device 320.

The data acquisition unit 321 acquires the time-series data b1 of the evaluation value A as input data from the diagnosis device for electric motor (step S111).

The inference unit 322 infers an abnormality indication of the electric motor using the trained model 314. That is, the time-series data of the evaluation value A acquired by the data acquisition unit is inputted to the trained model 314 (step S112), whereby an abnormality indication inference result 323 for the electric motor inferred from the time-series data of the evaluation value A can be outputted (step S113).

The abnormality indication inference result 323 for the electric motor is outputted from the diagnosis device 100, 100*a*, 100*b* for electric motor to, for example, the monitoring device 200 (step S114).

For example, in a case where it is inferred that there is an abnormality indication, information about this fact is transmitted to the monitoring device 200. Since the abnormality indication is acquired as early as possible, maintenance of the electric motor 5 can be executed in a planned manner, and a stop period of the mechanical equipment 6 connected to the electric motor 5 can be adjusted. Operation in step S114 is not limited to transmission of information to the monitoring device 200. For example, information that there is an abnormality indication may be displayed on the display unit 13 via the calculation processing unit 10, signals of an abnormality indication, an alarm, and the like may be outputted from the external output unit 15 to the outside, or such information may be reflected in the driving control device 17 so as to perform driving with the load of the electric motor 5 reduced. As described above, by obtaining an abnormality indication of the electric motor 5 through inference, it becomes possible to take various measures until the electric motor leads to abnormality.

In a case where it is inferred that there is no abnormality indication of the electric motor, it is not necessary to perform urgent maintenance of the target electric motor, thus obtaining an effect that a maintenance plan for a lot of electric motors 5 present in a plant can be smoothly executed. As described above, by collecting information about presence/absence of abnormality indications of electric motors in the monitoring device 200, it becomes possible to execute a maintenance plan for a lot of electric motors 5 present in a plant or change the maintenance plan quickly.

In the present embodiment 5, it has been described that the abnormality indication inference result 323 for the electric motor is outputted using the trained model 314 obtained through learning by the model generation unit 312. However, such a trained model may be acquired from another outside part and an abnormality indication inference result may be outputted on the basis of the acquired trained model.

In the present embodiment 5, the learning phase and the usage phase have been described separately. In this regard, the learning phase may be performed first and then the usage phase may be performed, or both phases may be performed in parallel. In a case of performing both phases in parallel, a certain threshold for completion of learning, e.g., the number of acquired data, is provided, only learning is performed while learning is not completed, and then both phases are performed in parallel after learning is completed.

Figure 24:
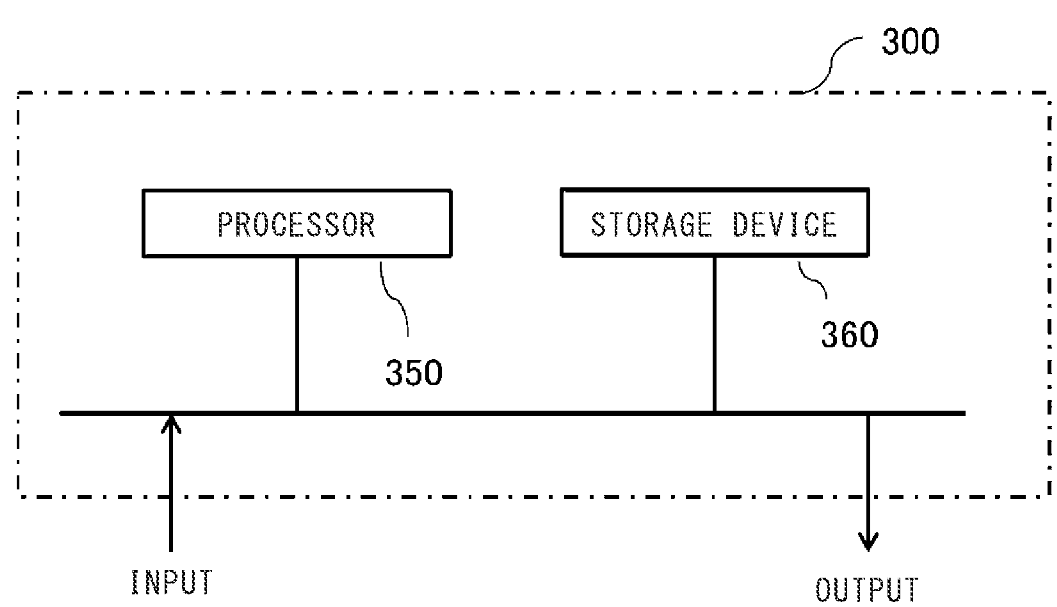
FIG. 24 is a hardware configuration diagram of the abnormality indication inference device for electric motor according to embodiment 5.

The abnormality indication inference device 300 for electric motor is composed of a processor 350 and a storage device 360, as shown in a hardware example in FIG. 24. This configuration is the same as the hardware described in FIG. 2 and therefore the description thereof is omitted.

The processor 350 implements the functions of the learning device 310 and the inference device 320 of the abnormality indication inference device 300 for electric motor, by executing a program.

As described above, according to embodiment 5, the effects in embodiment 1 are provided, and in addition, a trained model is generated using, as training data, a combination of the time-series data b1 of the evaluation value A and the winding short-circuit determination result b2 acquired by the diagnosis device for electric motor, and the time-series data b1 of the evaluation value A acquired from the diagnosis device for electric motor is inputted to the trained model, whereby an abnormality indication of the electric motor is inferred. Thus, it becomes possible to perform sound operation and a sound maintenance plan for the electric motor on the basis of the above inference result.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 main circuit
2 circuit breaker
3 electromagnetic contactor
4 instrument transformer
5 electric motor
6 mechanical equipment
7 current detection circuit
8 instrument voltage transformer
9 voltage detection circuit
10 calculation processing unit
11 storage unit
12 setting circuit
13 display unit
14 driving circuit
15 external output unit
16 communication circuit
17 driving control device (inverter)
20 current conversion unit
20*a* current voltage conversion unit
21 effective value calculation unit
22 inverter driving frequency calculation unit
23 negative-phase-sequence current calculation unit
24 voltage imbalance rate calculation unit
30 initial analysis unit
31 initial negative-phase-sequence current analysis unit
40, 40*a* determination unit
41 operation state determination unit
42 voltage imbalance determination unit
50 analysis unit
51 evaluation value analysis unit
60 abnormality determination unit
61 winding short-circuit determination unit
100, 100*a*, 100*b* diagnosis device for electric motor
200 monitoring device
300 abnormality indication inference device for electric motor
310 learning device
311 data acquisition unit
312 model generation unit
313 trained model storage unit
314 trained model
320 inference device
321 data acquisition unit
322 inference unit
323 abnormality indication inference result for electric motor
350, 1001 processor
360, 1002 storage device

The invention claimed is:

1. A diagnosis device for electric motor, comprising:

a current detection circuit for detecting current of an electric motor driven by an inverter; and a calculation processor which receives an output of the current detection circuit and performs determination for winding short-circuit abnormality of the electric motor, wherein the calculation processor includes an operation state determination circuitry which calculates a current effective value from the current of the electric motor and performs determination for an operation state, an inverter driving frequency calculation circuitry which calculates an inverter driving frequency, an initial negative-phase-sequence current analysis circuitry which analyzes initial negative-phase-sequence current in a normal state in accordance with the calculated inverter driving frequency, an evaluation value analysis circuitry which calculates an evaluation value for winding short-circuit from a difference between negative-phase-sequence current calculated from the current of the electric motor during driving and the initial negative-phase-sequence current corresponding to the inverter driving frequency calculated during driving, and a winding short-circuit determination circuitry which performs determination for winding short-circuit of the electric motor through comparison between the calculated evaluation value and a predetermined evaluation threshold.

2. The diagnosis device for electric motor according to claim 1, wherein the inverter driving frequency calculation circuitry calculates the inverter driving frequency from a waveform of the current detected by the current detection circuit or calculates the inverter driving frequency using a signal received from the inverter.

3. The diagnosis device for electric motor according to claim 1, wherein the initial negative-phase-sequence current analysis circuitry stores, in a map form, the initial negative-phase-sequence current corresponding to the inverter driving frequency.

4. The diagnosis device for electric motor according to claim 1, wherein the winding short-circuit determination circuitry changes the evaluation threshold in accordance with the inverter driving frequency or the current effective value calculated during driving.

5. The diagnosis device for electric motor according to claim 1, further comprising a voltage detection circuit for detecting voltage of the electric motor, wherein the calculation processor includes the operation state determination circuitry which calculates the current effective value and a voltage effective value from the current and the voltage of the electric motor, respectively, and performs determination for the operation state, a voltage imbalance rate determination circuitry which calculates a voltage imbalance rate from the voltage of the electric motor, compares the calculated voltage imbalance rate and a set voltage imbalance rate threshold, and determines whether or not to perform winding short-circuit determination, the initial negative-phase-sequence current analysis circuitry which, in a case where the voltage imbalance rate determination circuitry determines that winding short-circuit determination is to be performed, analyzes the initial negative-phase-sequence current in the normal state in accordance with the inverter driving frequency calculated by the inverter driving frequency calculation circuitry, the evaluation value analysis circuitry which, in a case where the voltage imbalance rate determination circuitry determines that winding short-circuit determination is to be performed, calculates the evaluation value for winding short-circuit from the difference between the negative-phase-sequence current calculated from the current of the electric motor during driving and the initial negative-phase-sequence current corresponding to the inverter driving frequency, and the winding short-circuit determination circuitry which performs determination for winding short-circuit of the electric motor through comparison between the evaluation value and the predetermined evaluation threshold.

6. The diagnosis device for electric motor according to claim 5, wherein the inverter driving frequency calculation circuitry calculates the inverter driving frequency from a waveform of the current detected by the current detection circuit or calculates the inverter driving frequency using a signal received from the inverter.

7. The diagnosis device for electric motor according to claim 5, wherein the initial negative-phase-sequence current analysis circuitry stores at least one of a map in which the voltage imbalance rate, the inverter driving frequency, and the initial negative-phase-sequence current are associated with each other, a map in which the voltage imbalance rate, the voltage effective value, and the initial negative-phase-sequence current are associated with each other, and a map in which the voltage imbalance rate, positive-phase-sequence voltage of the electric motor, and the initial negative-phase-sequence current are associated with each other.

8. The diagnosis device for electric motor according to claim 5, wherein the winding short-circuit determination circuitry changes the evaluation threshold, using any of the inverter driving frequency, the voltage effective value, and positive-phase-sequence voltage of the electric motor, calculated during driving.

9. The diagnosis device for electric motor according to claim 1, the diagnosis device being configured integrally with the inverter which drives the electric motor.

10. An abnormality indication inference device for electric motor, used with the diagnosis device for electric motor according to claim 1, the abnormality indication inference device comprising:

a learning device including a data acquisition circuitry which acquires training data including the evaluation value and a winding short-circuit determination result corresponding to the evaluation value, from the diagnosis device for electric motor, and a model generation circuitry which generates a trained model for inferring an abnormality indication inference result for the electric motor from data of the evaluation value of the diagnosis device for electric motor, using the training data; and an inference device including an inference circuitry which outputs an abnormality indication inference result for the electric motor from data of the evaluation value of the diagnosis device for electric motor, using the trained model.

11. A diagnosis method for electric motor, comprising the steps of:

detecting current of an electric motor driven by an inverter;

calculating an effective value from the current of the electric motor and performing determination for an operation state of the electric motor;

calculating an inverter driving frequency for driving the electric motor;

analyzing initial negative-phase-sequence current in a normal state in accordance with the calculated inverter driving frequency;

calculating an evaluation value for winding short-circuit from a difference between negative-phase-sequence current calculated from the current of the electric motor during driving and the initial negative-phase-sequence current corresponding to the inverter driving frequency calculated during driving; and performing determination for winding short-circuit of the electric motor through comparison between the calculated evaluation value and a predetermined evaluation threshold.

12. A diagnosis method for electric motor according to claim 11, wherein in the step of performing determination for the winding short-circuit, the evaluation threshold is changed in accordance with the inverter driving frequency during driving.

* * * * *